United States Patent
Chang et al.

(10) Patent No.: US 9,825,622 B2
(45) Date of Patent: Nov. 21, 2017

(54) CASCODE SWITCH CIRCUIT

(71) Applicant: ELECTRONICS AND TELECOMMUNICATIONS RESEARCH INSTITUTE, Daejeon (KR)

(72) Inventors: Woojin Chang, Daejeon (KR); Sang Choon Ko, Daejeon (KR); Jae Kyoung Mun, Daejeon (KR); Young Rak Park, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/217,271

(22) Filed: Jul. 22, 2016

(65) Prior Publication Data
US 2017/0201247 A1    Jul. 13, 2017

(30) Foreign Application Priority Data
Jan. 11, 2016    (KR) .................. 10-2016-0003289

(51) Int. Cl.
H03K 17/687    (2006.01)
H03K 17/081    (2006.01)
H03K 17/74    (2006.01)

(52) U.S. Cl.
CPC ....... *H03K 17/08104* (2013.01); *H03K 17/74* (2013.01)

(58) Field of Classification Search
CPC .................. H03K 17/08104; H03K 17/74
See application file for complete search history.

(56) References Cited

U.S. PATENT DOCUMENTS

| 6,633,195 | B2 * | 10/2003 | Baudelot | H01L 27/098 257/E27.069 |
| 6,822,842 | B2 * | 11/2004 | Friedrichs | H03K 17/102 327/309 |
| 7,501,670 | B2 | 3/2009 | Murphy | |
| 7,719,055 | B1 | 5/2010 | McNutt et al. | |
| 8,649,198 | B2 * | 2/2014 | Kuzumaki | H02M 7/5387 363/132 |
| 8,710,543 | B2 * | 4/2014 | Ichikawa | H03K 17/107 257/133 |
| 8,723,589 | B2 * | 5/2014 | Biela | H03K 17/102 327/430 |

(Continued)

OTHER PUBLICATIONS

SemiSouth, "SSJHB12R085-1 Half-Bridge Demo Board User's Guide", www.SemiSouth.com, pp. 1-20, Apr. 2012.

*Primary Examiner* — Kenneth B Wells
(74) *Attorney, Agent, or Firm* — Rabin & Berdo, P.C.

(57) ABSTRACT

A cascode switch circuit includes a first transistor, a second transistor, and a protector. A first transistor receives a signal from a first terminal through a first end and transfers the signal to a second end in response to a first control signal. A second transistor delivers the signal that the first transistor transfers to a second terminal in response to a second control signal. A protector is connected between a gate of the first transistor and the second terminal. The first control signal is provided to allow the first transistor to operate in a normally-on state. The second control signal is provided to allow the second transistor to operate in a normally-off state.

17 Claims, 30 Drawing Sheets

(56) References Cited

U.S. PATENT DOCUMENTS

| | | | | |
|---|---|---|---|---|
| 8,729,566 | B2* | 5/2014 | Domes | H03K 17/063 |
| | | | | 257/183 |
| 9,048,119 | B2* | 6/2015 | Kanazawa | H01L 27/0883 |
| 9,116,533 | B2* | 8/2015 | Buthker | G06F 3/247 |
| 9,190,993 | B1* | 11/2015 | Li | H03K 17/60 |
| 9,559,683 | B2* | 1/2017 | Zojer | H02M 7/219 |
| 2009/0167411 | A1* | 7/2009 | Machida | H01L 27/0605 |
| | | | | 327/427 |
| 2012/0133420 | A1* | 5/2012 | Draxelmayr | H02M 3/337 |
| | | | | 327/430 |
| 2012/0262220 | A1 | 10/2012 | Springett | |
| 2014/0049296 | A1* | 2/2014 | Jeon | H03K 3/012 |
| | | | | 327/109 |
| 2014/0055192 | A1* | 2/2014 | Ritenour | H03K 17/08 |
| | | | | 327/436 |
| 2014/0097685 | A1 | 4/2014 | Jun et al. | |
| 2014/0285933 | A1 | 9/2014 | Kim et al. | |
| 2014/0300410 | A1 | 10/2014 | Buthker et al. | |

\* cited by examiner

CASCODE SWITCH CIRCUIT

CROSS-REFERENCE TO RELATED APPLICATIONS

This U.S. non-provisional patent application claims priority under 35 U.S.C. §119 of Korean Patent Application No. 10-2016-0003289, filed on Jan. 11, 2016, the entire contents of which are hereby incorporated by reference.

BACKGROUND

The present disclosure herein relates to a semiconductor device, and more particularly, to a cascode switch circuit of a semiconductor device.

An excessive current or voltage due to high operating speed of a semiconductor device or inductance or capacitance in a peripheral circuit may be generated from a semiconductor device. Accordingly, the ability to respond to the surge voltage of a semiconductor device is required. The surge voltage refers to an excessive waveform of electrical current, voltage, or power. Such the surge voltage may radiate a thermal energy enough for destroying an electronic component. This results in a reduced service life or function deterioration of a semiconductor device. The repetition of small surge voltage may deteriorate and destroy semiconductor circuits configuring a semiconductor device. Alternatively, strong surge voltage may destroy a semiconductor device at a time.

As one of a semiconductor device, there is a switch circuit. A switch circuit used for a power electronic system requires high breakdown voltage, normally-off operating characteristics, low-on resistance, high-current characteristics, and high-speed switching characteristics. Especially, when a switching circuit available for a high-speed switching operation is used, the sizes of an inductor and a capacitor in a power electronic system may be reduced. Therefore, the size and manufacturing cost of a power electronic system may be reduced. Additionally, a cascode switch circuit may be manufactured using a device having normally-on operating characteristics. Such a cascode switch circuit may have high current characteristics with low manufacturing cost and size.

Accordingly, a cascode switch circuit that combines a device having low breakdown voltage and normally-off operating characteristics and a device having high breakdown voltage and normally-on operating characteristics is studied. However, such a cascode switch circuit also may be vulnerable to surge voltage or current. Therefore, in designing a cascode switch circuit, a method of increasing a resistance to such a surge voltage is studied.

SUMMARY

The present disclosure provides a cascode switch circuit having a resistance to surge voltage or current.

An embodiment of the inventive concept provides a cascode switch circuit including: a first transistor configured to receive, by using one end, a signal from a first terminal according to a first control signal; a second transistor configured to deliver the signal that the first transistor delivers to a second terminal in response to a second control signal; and a protector connected between a gate of the first transistor and the second terminal, wherein the first control signal is provided to allow the first transistor to operate in a normally-on state, and the second control signal is provided to allow the second transistor to operate in a normally-off state.

In an embodiment of the inventive concept, a cascode switch circuit includes: a first transistor configured to receive, by using one end, a signal from a first terminal according to a first control signal; a second transistor configured to deliver the signal that the first transistor delivers to a second terminal in response to a second control signal; and a first diode connected in parallel to the first transistor and having a cathode connected to one end of the first transistor and an anode connected to the other end of the first transistor, wherein the first control signal is provided to allow the first transistor to operate in a normally-on state, and the second control signal is provided to allow the second transistor to operate in a normally-off state.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIGS. 8A to 18A and 8B to 18B and 8C to 18C are circuit diagrams illustrating cascode switches according to an embodiment of the inventive concept.

DETAILED DESCRIPTION

Figure 1A:
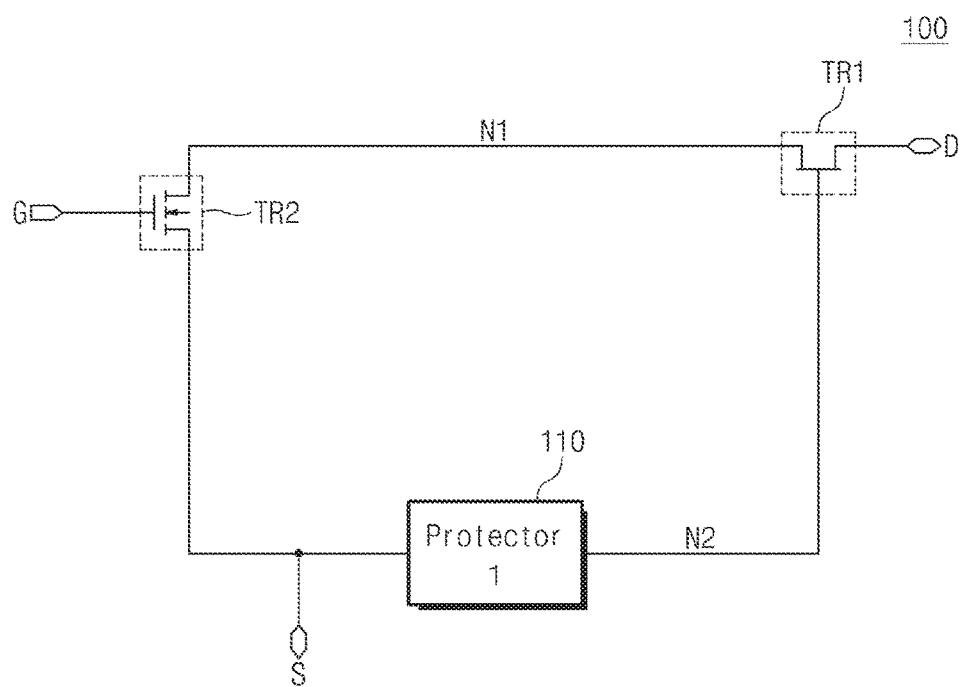
FIG. 1A is a circuit diagram illustrating a cascode switch according to an embodiment of the inventive concept.

It should be understood that preceding general description and the following detailed description are all illustrative and additional description of the claimed invention is provided. Reference symbols are shown in preferred embodiments of the inventive concept in detail, and their examples are shown in reference drawings. In any case possible, the same reference numerals are used in the description and drawings to refer to the same or similar parts.

Hereinafter, a cascode switch is used as an example to describe the features and functions of the inventive concept. However, those skilled in the art may easily understand other advantages and performances of the inventive concept according to contents listed herein. The inventive concept may be implemented or applied also through other embodiments. Moreover, detailed description may be modified or changed according to a perspective view and application without significantly departing from the scope, technical ideas, and another purpose of the inventive concept.

FIG. 1A is a circuit diagram illustrating a cascode switch according to an embodiment of the inventive concept. Referring to FIG. 1A, a cascode switch 100 may include first and second transistors TR1 and TR2, a first protector 110, a gate terminal G, a source terminal S, and a drain terminal D.

The first transistor TR1 is connected between a first node N1 and the drain terminal D and is turned on or off according to a voltage level of a second node N2. The second transistor TR2 is connected between the first node N1 and the source terminal S and is turned on or off according to a voltage level of the gate terminal G. The first protector 110 is connected between the source terminal S and the second node N2.

The first transistor TR1 may have high breakdown voltage and normally-on operating characteristics. The first transistor TR1 may be a field effect transistor (FET) including GaN and SiC. The second transistor TR2 may have low breakdown voltage and normally-off operating characteristics. The second transistor TR2 may be a field effect transistor (FET) including Si, GaN, and SiC. The first protector 110 may prevent the destruction of the first transistor TR1 due to a surge voltage that may be occurred from the source terminal S. An operation of the first protector 110 will be described in detail with reference to FIG. 2.

The gate terminal G, the source terminal S, and the drain terminal D are the input/output terminals of the cascode switch 100. A circuit of FIG. 1A operates as a general cascode switch circuit. An operating of the circuit as follows.

According to an embodiment of the inventive concept, the first transistor TR1 may have normally-turn-on characteristics. For example, it is assumed that the source terminal S and the second node N2 are conducted through the first protector 110. When a voltage of the source terminal S is about 0 V, a voltage of the second node N2 becomes about 0 V. In this case, the first transistor TR1 operates in a turn-on state. Then, a control signal is applied to the gate terminal G. The control signal should be higher than a threshold voltage of the second transistor TR2. In response to the control signal, the second transistor TR2 becomes a turn-on state. Due to this, both the first and second transistors TR1 and TR2 are turned on and an input signal of the drain terminal D is delivered to the source terminal S.

Figure 1B:
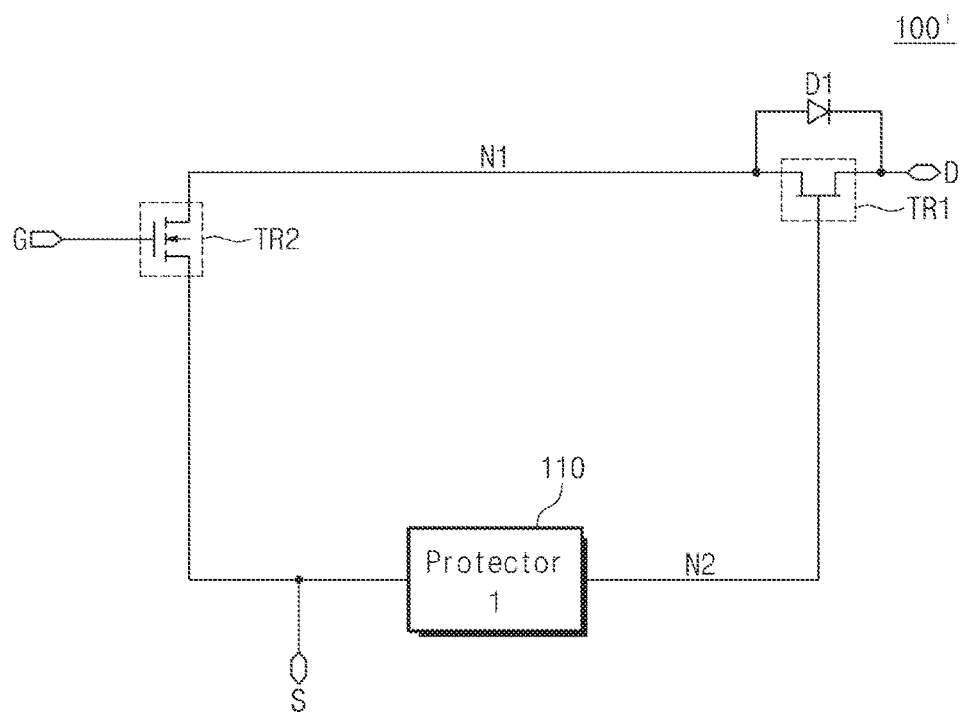
FIGS. 1B and 1C are circuit diagrams illustrating cascode switches according to another embodiment of the inventive concept.
Figure 1C:
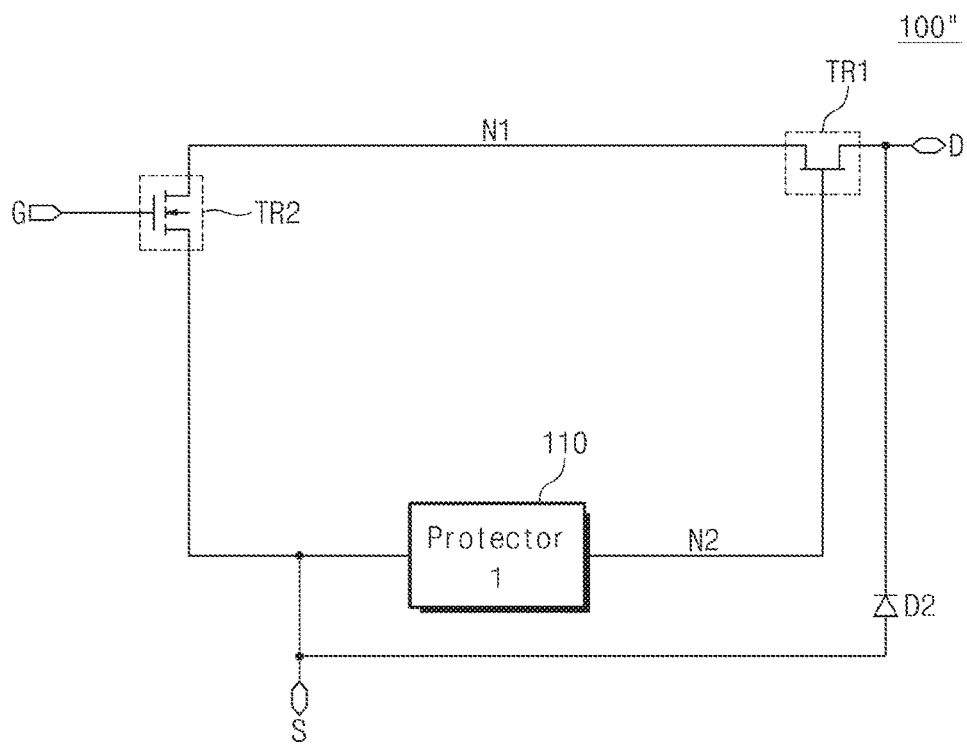

FIGS. 1B and 1C are circuit diagrams illustrating cascode switches according to another embodiment of the inventive concept.

Referring to FIG. 1A, a cascode switch 100' may include first and second transistors TR1 and TR2, a first protector 110, a first diode D1, a gate terminal G, a source terminal S, and a drain terminal D. Referring to FIG. 1A, a cascode switch 100' of FIG. 1B further includes the first diode D1. The configurations and roles of the remaining components (that is, first and second transistors, a first protector, a gate terminal, a source terminal, and a drain terminal D) except for the first diode D1 are identical to those of the cascode switch 100 of FIG. 1A. Accordingly, description for the operations and configurations will be omitted.

The anode of the first diode D1 is connected to the first node N1. The cathode of the first diode D1 is connected to the drain terminal D. According to the above-mentioned embodiment, it is assumed that the first transistor TR1 is a field effect transistor (FET) including GaN, and the second transistor TR2 is a field effect transistor FET including Si. In this case, there is a body diode in the second transistor TR2 structurally. On the other hand, there is no body diode in the first transistor TR1 structurally. The source of the first transistor TR1 is the first node N1 and the gate of the first transistor TR1 is the second node N2.

The role of the first diode D1 is as follows. First, it is assumed that a voltage of more than a threshold voltage is applied to the gate terminal G. Additionally, it is assumed that the cascode switch 100' operates in a forward mode in which high voltage is applied to the drain terminal D and low voltage is applied to the source terminal S. Then, a voltage of less than a threshold voltage may be applied to the gate terminal G, and the second transistor TR2 may be turned off. In this case, since the first transistor TR1 is turned on, current flows from the drain terminal D to the first node N1. Due to this current flow, a voltage of the first node N1 is increased. After a predetermined time, due to the rise of the voltage of the first node N1, a voltage difference between the second node N2 and the first node N1 becomes less than a threshold voltage. At this point, the first transistor TR1 becomes turned off also. Accordingly, since the first and second transistors TR1 and TR2 are turned off, the first node N1 becomes a floating state. When the first node N1 becomes a floating state, the first node N1 may have a voltage that cannot be specified by an external environmental factor. For example, the external environmental factor may be capacitive coupling or charge sharing.

In this state, a reverse mode is assumed in which surge voltage is applied to the source terminal S and low voltage or 0 V is applied to the drain terminal D. Surge voltage refers to a case that high voltage is applied suddenly for a short time. Accordingly, a situation is assumed in which the first transistor TR1 does not respond to the surge voltage of the source terminal S and immediately before it is turn on. At this point, the body diode of the second transistor TR2 is turned on by the rising voltage of the source terminal S. In this case, current may flow in a direction from the source terminal S to the first node N1 through the body diode of the second transistor TR2. That is, leakage current may flow in a direction from the source terminal S having a high voltage to the first node N1 having a lower voltage than the high voltage. Since this case is before the first transistor TR1 is turned on and does not have a body diode, the first transistor TR1 can not form a current path. Accordingly, leakage current does not flow through the first transistor TR1. Due to this, the gate of the first transistor TR1 may be destroyed.

At this point, when a voltage difference between the first node N1 and the drain terminal D becomes greater than a diode voltage Vf of the first diode D1 due to leakage current, the first diode D1 can be turned on. Then, the turned-on first diode D1 forms a current path through which the above-mentioned leakage current flows. As a result, the first diode D1 forms a current path flowing from the first node N1 to the drain terminal D1 to prevent the destruction of the first transistor TR1. That is, the first diode D1 performs the same role as the body diode of the second transistor TR2.

Referring to FIG. 1C, a cascode switch 100" may include first and second transistors TR1 and TR2, a first protector 110, a second diode D2, a gate terminal G, a source terminal S, and a drain terminal D. Referring to FIG. 1A, the cascode switch 100" of FIG. 1C further includes the second diode D2. The configurations and roles of the remaining components (that is, first and second transistors, a first protector, a gate terminal, a source terminal, and a drain terminal D) except for the second diode D2 are identical to those of the cascode switch 100 of FIG. 1A. Accordingly, description for the operations and configurations will be omitted.

The anode of the second diode D2 is connected to the source terminal S. The cathode of the second diode D2 is connected to the drain terminal D. The role of the second diode D2 is as follows. It is assumed that the first transistor TR1 is destroyed when the above-mentioned situation of FIG. 1B occurs in the cascode switch 100" of FIG. 1C. At this point, the second diode D2 is turned on by a surge voltage occurred from the source terminal S. Accordingly, unlike the cascode switch 100' of FIG. 1B, the cascode switch 100" of FIG. 1C forms a direct current path from the source terminal S to the drain terminal D. Through this current path, the current generated by surge voltage flows. As a result, the generated current does not flow into the first transistor TR1. Accordingly, the second diode D2 prevents the destruction of the first transistor TR1.

The cascode switch 100' of FIG. 1B allows leakage current to flow through the body diode of the second transistor TR2 and the first diode D1. Accordingly, a voltage of more than the two times of diode voltage Vf should be applied, so that a current path for leakage current is formed. On the other hand, in relation to the cascode switch 100" of FIG. 1C, the second diode D2 is turned on with only a voltage of more than the one-time diode voltage Vf and accordingly, a current path is formed. Accordingly, compared to the cascode switch 100' of FIG. 1B, the cascode switch 100" is more effective to prevent the destruction of the first transistor TR1 in a reverse mode.

Figure 1D:
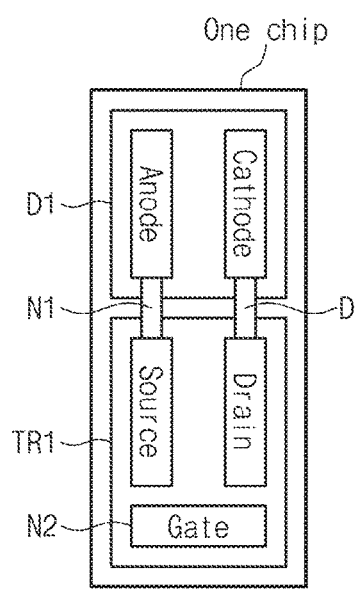
FIG. 1D is an arrangement drawing illustrating a method of implementing a first transistor and a first diode shown in FIG. 1B with one chip.

FIG. 1D is an arrangement drawing illustrating a method of implementing a first transistor and a first diode shown in FIG. 1B as one chip. Referring to FIG. 1D, the first transistor TR1 and the first diode D1 may be implemented as one chip instead of separate devices. If two devices are implemented with separate electronic devices, since wiring is required by a metallic line, inductance on a signal path is increased. Accordingly, when two devices are implemented as one chip, since inductance on a transmission line due to wiring is reduced, switching speed and efficiency may be improved. Additionally, by integrating two devices in one chip, the number of wirings may be reduced and manufacturing cost required for other packaging may be reduced.

The first transistor TR1 may include a drain, a source, and a gate. The first diode D1 may include a cathode and an anode. On one chip, the source of the first transistor TR1 is connected to the anode of the first diode D1 through a metallic line. The metallic line corresponds to the first node N1 of FIG. 1B. The drain of the first transistor TR1 is connected to the cathode of the first diode D1 through a metallic line. The metallic line corresponds to the drain terminal D of FIG. 1B. The gate of the first transistor TR1 corresponds to the second node N2 of FIG. 1B. The first transistor TR1 and the first diode D1 may be implemented on one chip like the above-mentioned structure. An operation of a circuit is identical to those of the first transistor TR1 and the first diode D1. Accordingly, detailed description for this will be omitted.

Figure 1E:
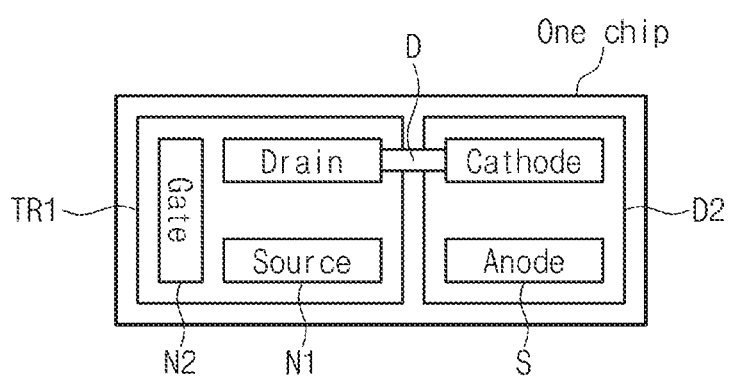
FIG. 1E is an arrangement drawing illustrating a method of implementing a first transistor and a second diode shown in FIG. 1C as one chip.

FIG. 1E is an arrangement drawing illustrating a method of implementing a first transistor and a second diode shown in FIG. 1C as one chip. Referring to FIG. 1E, the first transistor TR1 and the second diode D2 may be implemented as one chip instead of separate devices. In this case, since advantages are the same as the above, the description thereof will be omitted.

The first transistor TR1 may include a drain, a source, and a gate. The second diode D2 may include a cathode and an anode. On one chip, the drain of the first transistor TR1 is connected to the cathode of the second diode D2 through a metallic line. The metallic line corresponds to the drain terminal D of FIG. 1C. The anode of the second diode D2 is connected to the source terminal S of FIG. 1C. The gate of the first transistor TR1 corresponds to the second node N2 of FIG. 1C. The source of the first transistor TR1 corresponds to the first node N1 of FIG. 1C. The first transistor TR1 and the second diode D2 may be implemented on one chip like the above-mentioned structure. An operation of a circuit is identical to those of the first transistor TR1 and the second diode D2. Accordingly, detailed description for this will be omitted.

Figure 2:
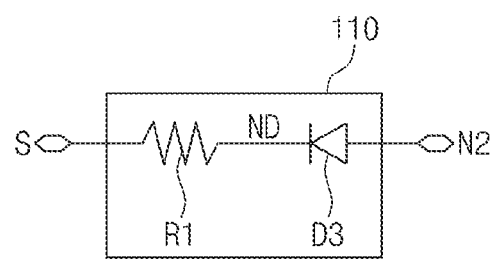
FIG. 2 is a circuit diagram illustrating a first protector shown in FIGS. 1A, 1B, and 1C exemplarily according to an embodiment of the inventive concept.

FIG. 2 is a circuit diagram illustrating a first protector shown in FIGS. 1A, 1B, and 1C exemplarily according to an embodiment of the inventive concept. Referring to FIG. 2, the first protector 110 may include a resistor R1 and a third diode D3 connected in series. The resistor R1 is connected between a source terminal S and a node ND. The cathode of the third diode D3 is connected to the node ND. The anode of the third diode D3 is connected to the second node N2. Hereinafter, the roles of the resistor R1 and the third diode D3 will be described with reference to FIG. 1A.

The role of the resistor R1 is as follows. For example, it is assumed that surge voltage is occurred and an excessive voltage is applied to the source terminal S or the drain terminal D. When surge voltage is applied to the source terminal S, an excessive voltage may be applied between the second node N1 and the first node N1 or between the second node N2 and the drain terminal D. In this case, leakage current may flow in a direction from the second node N2 to the first node N1 or the drain terminal D. Alternatively, when surge voltage is applied to the drain terminal D, excessive voltage may be applied between the drain terminal D and the second node N2. In this case, leakage current may flow from the drain terminal D to the second node N2 through the gate of the first transistor TR1. If the above-mentioned leakage current is excessive, the gate of the first transistor TR1 may be destroyed by the leakage current. At this point, the resistor R1 inserted between a node ND and the source terminal S reduces a leakage current amount flowing in the direction by 1/R. Accordingly, the resistor R1 prevents the destruction of the first transistor TR1 due to excessive current.

The role of the third diode D3 connected in series to the resistor R1 is as follows. For example, it is assumed that surge voltage originates from the source terminal S. In this case, an excessive voltage is applied to the second node N2. Accordingly, an excessive leakage current flows from the second node N2 to the first node N1 or the drain terminal D through the gate of the first transistor TR1. This may cause a gate destruction phenomenon of the first transistor TR1. At this point, the third diode D3 delivers a voltage, which is lower than a voltage of the source terminal S by a diode breakdown voltage, to the second node N2. This may reduce an excessive voltage applied to the gate of the first transistor TR1. Additionally, the third diode D3 is connected in a reverse direction based on the source terminal S where a surge voltage occurs. Accordingly, the third diode D3 may suppress such a leakage current. As a result, the third diode D3 may prevent a destruction phenomenon of the first transistor TR1 due to a surge voltage that may originate from the source terminal S.

For example, the resister R1 or the third diode D3 may be embedded in a chip where the cascode switch 100 is integrated. Alternatively, the resister R1 or the third diode D3 may be embedded as a passive device outside a chip where the cascode switch 100 is integrated.

Figure 3A:
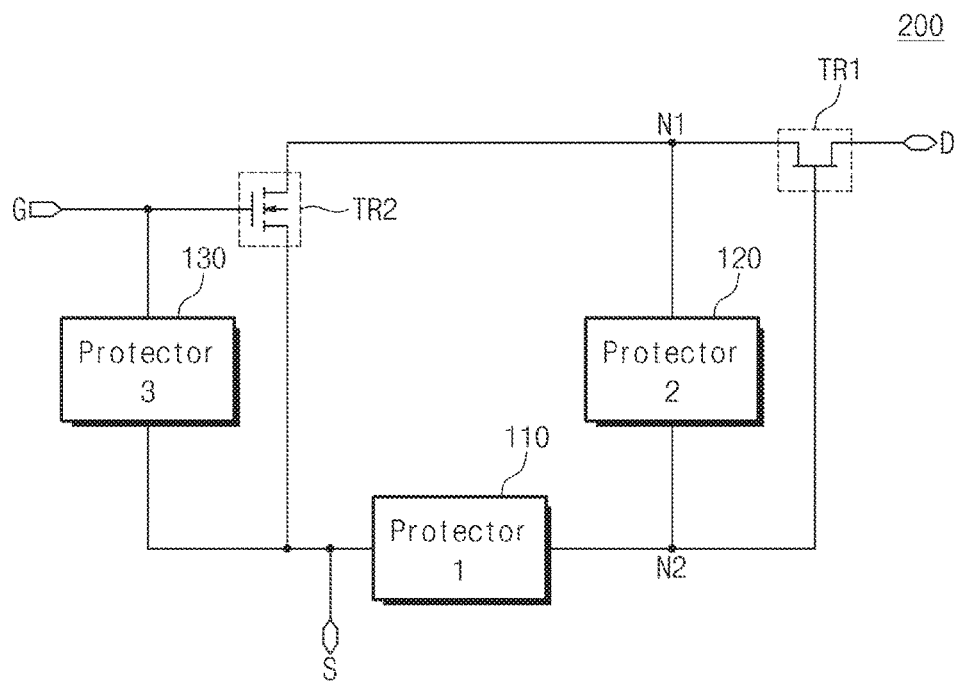
FIGS. 3A, 3B, and 3C are circuit diagrams illustrating cascode switches according to another embodiment of the inventive concept.
Figure 3B:
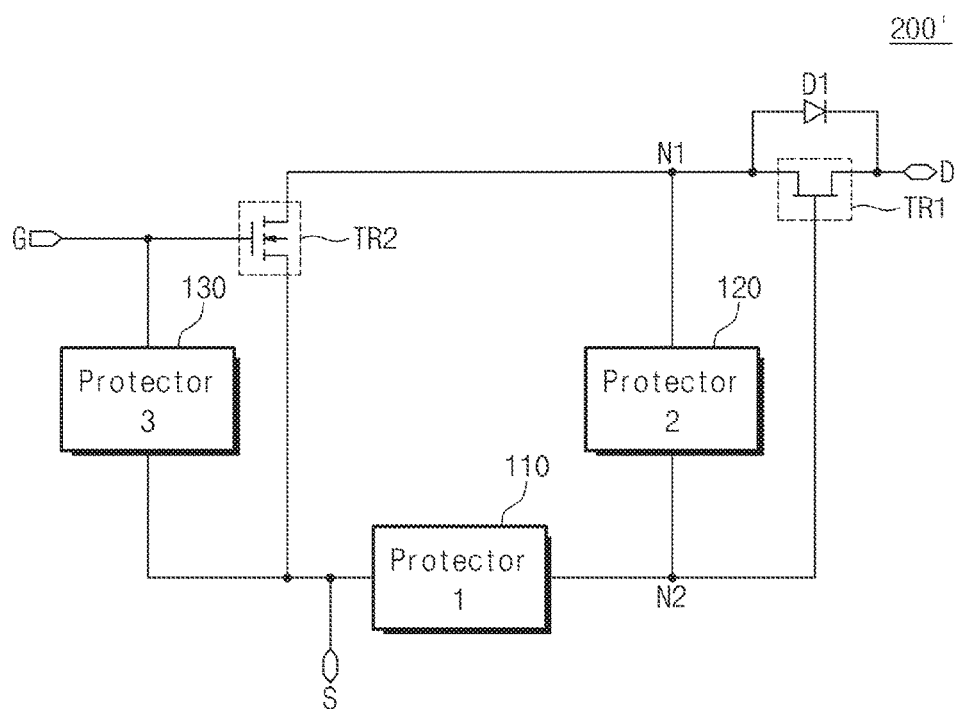
Figure 3C:
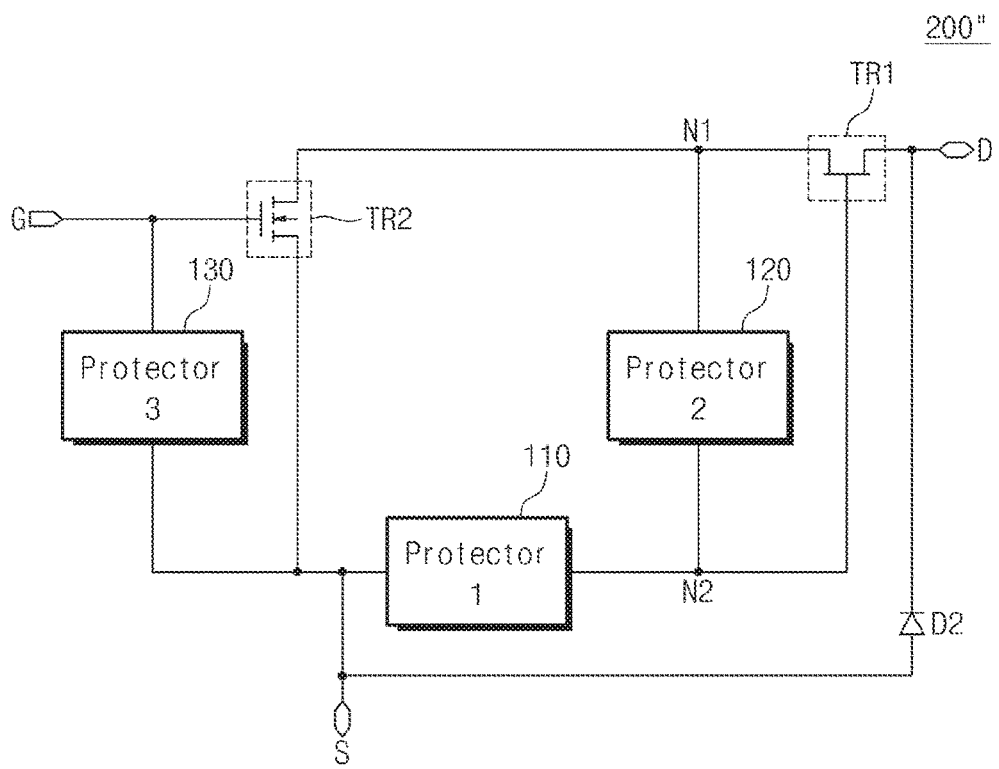

FIGS. 3A, 3B, and 3C are circuit diagrams illustrating cascode switches according to another embodiment of the inventive concept. Referring to FIG. 3A, a cascode switch 200 may include first and second transistors TR1 and TR2, first to third protectors 110, 120, and 130, a gate terminal G, a source terminal S, and a drain terminal D. Referring to FIG. 1A, the cascode switch 200 according to this embodiment further includes the second and third protectors 120 and 130.

The second protector 120 is connected between a first node N1 and a second N2. The second protector 120 may prevent the destruction of the first transistor TR1 due to a surge voltage that may originate from the source terminal S. The third protector 130 is connected between the gate terminal G and the source terminal S. The third protector 130 may prevent the destruction of the second transistor TR2 due to a surge voltage that may originate from the source terminal S.

Referring to FIG. 3B, a cascode switch 200' may include first and second transistors TR1 and TR2, first to third protectors 110, 120, and 130, a first diode D1, a gate terminal G, a source terminal S, and a drain terminal D. Referring to FIG. 3A, the cascode switch 200' of FIG. 3B further includes the first diode D1. The configuration and role of the first diode D1 are the same as described with reference to FIG. 1B. Accordingly, description for this is omitted.

Referring to FIG. 3C, a cascode switch 200" may include first and second transistors TR1 and TR2, first to third protectors 110, 120, and 130, a second diode D2, a gate terminal G, a source terminal S, and a drain terminal D. Referring to FIG. 3A, the cascode switch 200" of FIG. 3C further includes the second diode D2. The configuration and role of the second diode D2 are the same as described with reference to FIG. 1C. Accordingly, description for this is omitted. Embodiments and specific operations of the second and third protectors 120 and 130 shown in FIGS. 3A, 3B, and 3C are described with reference to FIGS. 4 and 5.

Figure 4:
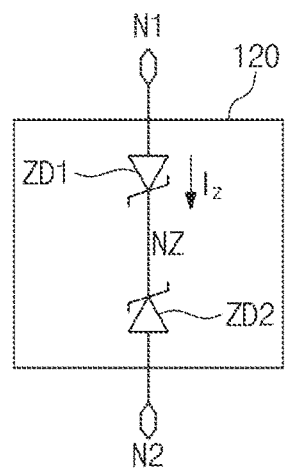
FIG. 4 is a circuit diagram illustrating a second protector shown in FIGS. 3A, 3B, and 3C exemplarily according to an embodiment of the inventive concept.

FIG. 4 is a circuit diagram illustrating a second protector shown in FIGS. 3A, 3B, and 3C exemplarily according to an embodiment of the inventive concept. Referring to FIG. 4, the second protector 120 of FIG. 3A may include first and second zener diodes ZD1 and ZD2 connected in series in a reverse direction. A connection relationship of the second protector 120 will be described with reference to FIG. 3A.

The cathodes of the first and second zener diodes ZD1 and ZD2 are connected to a node NZ. The anode of the first zener diode ZD1 is connected to the first node N1. The anode of the second zener diode ZD2 is connected to the second node N2. When a voltage of more than a predetermined level is applied to the first node N1 or the second node N2, the second protector 120 conducts the first node N1 and the second node N2. Such characteristics will be described with reference to FIG. 5.

Figure 5:
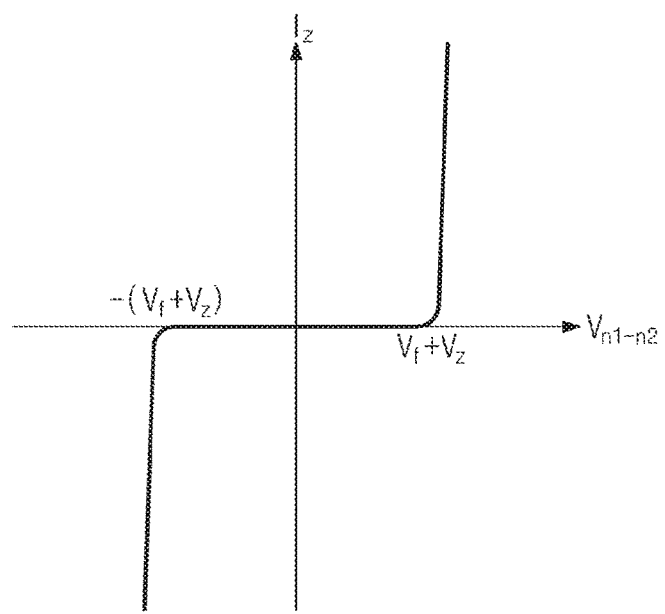
FIG. 5 is a graph illustrating characteristics of a second protector shown in FIGS. 3A, 3B, and 3C.

FIG. 5 is a graph illustrating characteristics of a second protector shown in FIGS. 3A, 3B, and 3C. When a voltage of more than a diode voltage Vf is applied to the anode, a single zener diode is turned on. In this case, a voltage difference between the anode and cathode of a zener diode becomes Vf. On the other hand, when a voltage of more than a threshold voltage Vz is applied to the cathode, a zener diode is turned on in a reverse direction In this case, a voltage difference between the anode and cathode of a zener diode becomes Vz. Accordingly, when a voltage difference Vn1−Vn2 at both ends N1 and N2 of the first and second zener diodes ZD1 and ZD2 of FIG. 4 becomes more than Vf+Vz, the first node N1 and the second node N2 are conducted so that current Iz flows. In this case, the voltage difference Vn1−Vn2 at both ends N1 and N2 is maintained at Vf+Vz. On the other hand, when the voltage difference Vn1−Vn2 at both ends N1 and N2 of the first and second zener diodes ZD1 and ZD2 becomes less than −(Vf+Vz), the first node N1 and the second node N2 are conducted so that current −Iz flows in the opposite direction. In this case, the voltage difference Vn1−Vn2 at both ends N1 and N2 is maintained at −(Vf+Vz).

When using the above-mentioned characteristics, the second protector 120 of FIG. 3A may prevent the destruction of the first transistor TR1 due to a surge voltage that may occur from the source terminal S. For example, it is assumed that surge voltage is occurred from the source terminal S. In this case, an excessive voltage is applied between the second node N2 connected to the source terminal S and the drain terminal D or the first node N1. This causes an excessive leakage current to the drain terminal D or the first node N1 through the gate of the first transistor TR1. As a result, the gate of the first transistor TR1 may be destroyed. At this point, when a voltage difference Vn1−Vn2 at both ends N1 and N2 of the second protector 120 becomes more than Vf+Vz by surge voltage, two zener diodes ZD1 and ZD2 are turned on. Then, the voltage difference Vn1−Vn2 at both ends N1 and N2 is fixed at a turn-on voltage Vf+Vz. That is, only a predetermined voltage difference instead of an excessive surge voltage is applied between the first node N1 and the second node N2. As a result, a destruction phenomenon of the first transistor TR1 due to surge voltage may be prevented.

The third protector 130 may have the same configuration as the second protector 120. That is, the third protector 130 may include third and fourth zener diodes ZD3 and ZD4 connected in series in a reverse direction. Referring to FIG. 3A, the third protector 130 is connected to the gate terminal G and the source terminal S. Furthermore, the third protector 130 has the characteristics described with reference to FIG. 5.

The third protector 130 may prevent the destruction of the second transistor TR2 due to a surge voltage that may originate from the source terminal S. In the event that the surge voltage originates from the source terminal S, an excessive voltage is applied between the source terminal S and the gate terminal G. Thereby, an excessive leakage current flows from the source terminal S to the gate terminal G through the gate of the second transistor TR2. This may cause a destruction phenomenon of the second transistor TR2. At this point, when a voltage difference at both ends S and G of the third protector 130 becomes more than Vf+Vz, the third and fourth zener diodes ZD3 and ZD4 are turned on. Then, a voltage difference at both ends S and G of the third protector 130 is fixed at Vf+Vz. Accordingly, through the same principle as the second protector 120, the third protector 130 may prevent a destruction phenomenon of the second transistor TR2 due to surge voltage.

Figure 6:
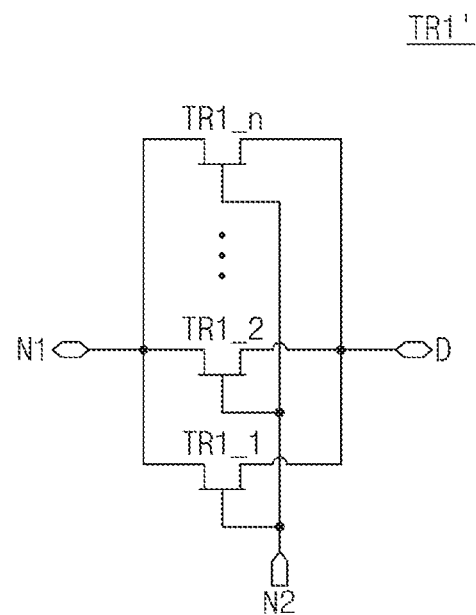
FIG. 6 is a circuit diagram illustrating a first transistor shown in FIGS. 1A to 1C and FIGS. 3A to 3C exemplarily according to an embodiment of the inventive concept.

FIG. 6 is a circuit diagram illustrating a first transistor shown in FIGS. 1A to 1C and FIGS. 3A to 3C exemplarily according to an embodiment of the inventive concept. Referring to FIG. 6, the first transistor TR1 may include a plurality of transistors TR1_1 to TR1_n. In this case, a current amount that the first transistor TR1 delivers is increased. An operation of the cascode switch 100 or 200 including the plurality of first transistors TR1_1 to TR1_n is identical to the above and thus its description is omitted.

Figure 7:
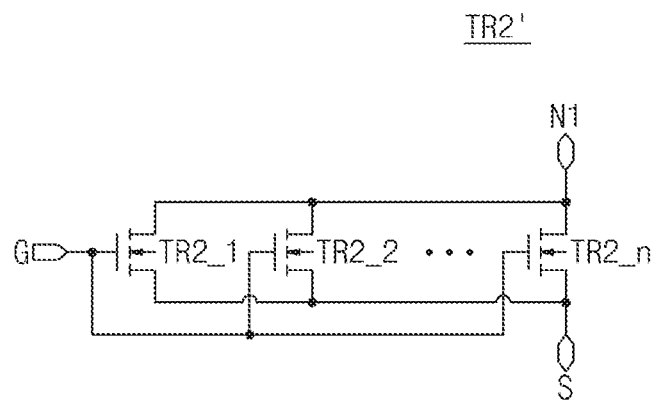
FIG. 7 is a circuit diagram illustrating a second transistor shown in FIGS. 1A to 1C and FIGS. 3A to 3C exemplarily according to an embodiment of the inventive concept.

FIG. 7 is a circuit diagram illustrating a second transistor shown in FIGS. 1A to 1C and FIGS. 3A to 3C exemplarily according to an embodiment of the inventive concept. Referring to FIG. 7, the second transistor TR2 may include a plurality of transistors TR2_1 to TR2_n. In this case, a current amount that the second transistor TR2 delivers is increased. An operation of the cascode switch 100 or 200 including the plurality of second transistors TR2_1 to TR2_n is identical to the above and thus its description is omitted.

Operations and characteristics of the cascode switch 100 or 200 according to the inventive concept are described above. Hereinafter, various embodiments according to a combination of the first protector 110, the second protector 120, and the third protector 130 are described.

FIGS. 8A to 18A and 8B to 18B and 8C to 18C are circuit diagrams illustrating cascode switches according to an embodiment of the inventive concept.

Figure 8A:
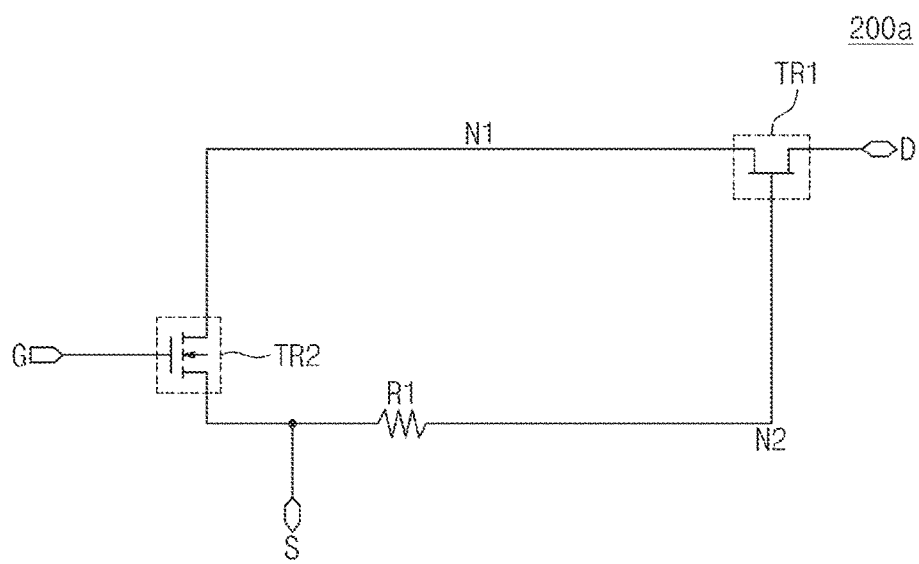

Referring to FIG. 8A, a cascode switch 200a may include first and second transistors TR1 and TR2 and a resistor R1. The basic configuration is identical to that of the cascode switch 200 of FIG. 3A. However, compared to FIG. 3A, the cascode switch 200a does not include the second and third protectors 120 and 130. Additionally, the cascode switch 200a includes the resistor R1 as an embodiment of the first protector 110. The resistor R1 is connected between a source terminal S and a second node N2. The resistor R1 prevents the destruction of the first transistor TR1 due to surge voltage. Operations of cascode switches 200a to 200k, 200a' to 200k', and 200a" to 200k" shown in FIGS. 8A to 18A and 8B to 18B and 8C to 18C are identical to the above. Accordingly, detailed description for this will be omitted.

Figure 8B:
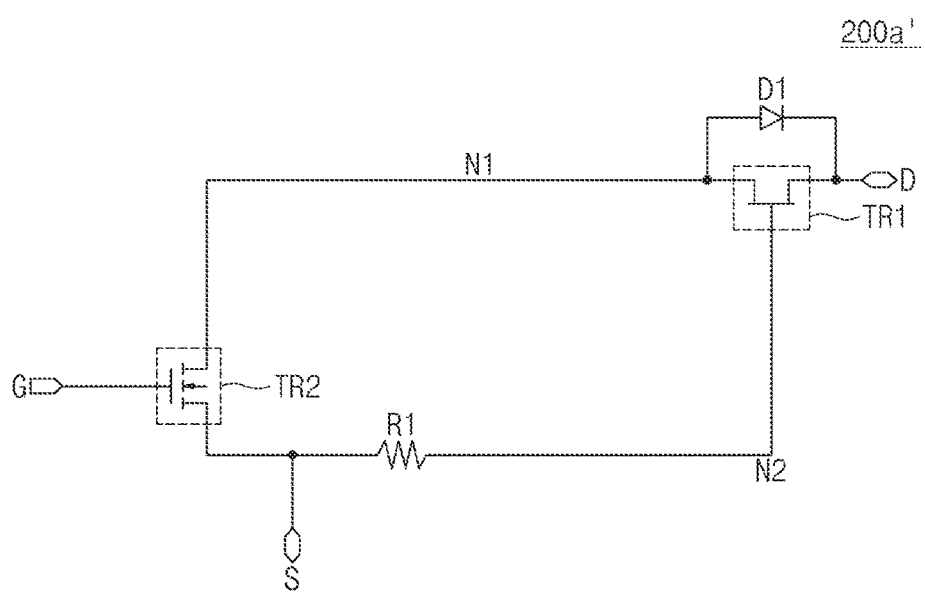

Referring to FIG. 8B, the cascode switch 200a' may include first and second transistors TR1 and TR2, a resistor R1, and a first diode D1. Compared to the cascode switch 200a of FIG. 8A, except that the cascode switch 200a' of FIG. 8B further includes the first diode D1, its configuration and role are identical. The anode of the first diode D1 is connected to the first node N1. The cathode of the first diode D1 is connected to the drain terminal D. The configuration and role of the first diode D1 shown in FIGS. 8B to 18B are the same as described with reference to FIG. 1B. Accordingly, detailed description for this will be omitted.

Figure 8C:
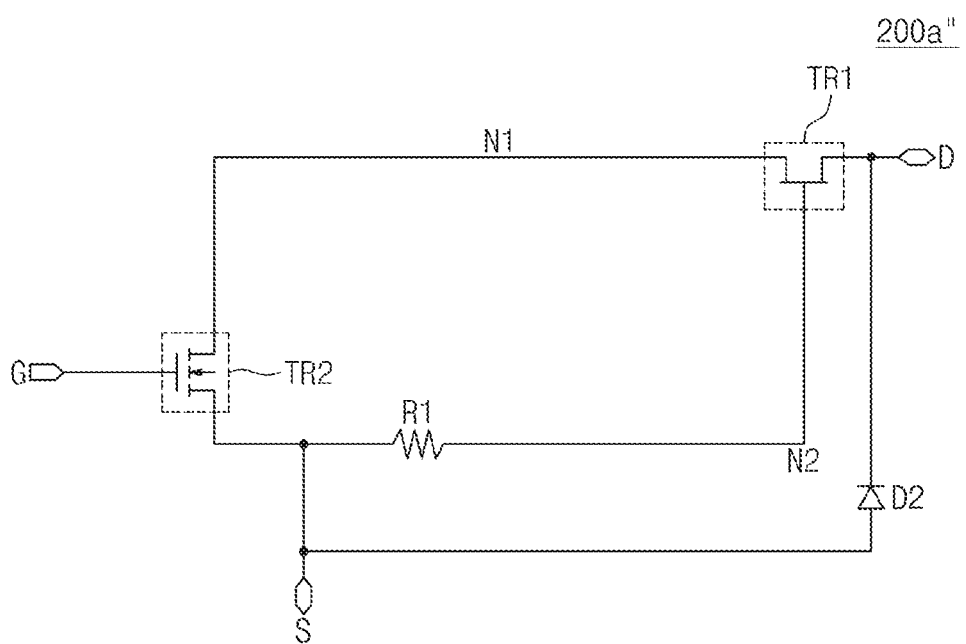

Referring to FIG. 8C, the cascode switch 200a" may include first and second transistors TR1 and TR2, a resistor R1, and a second diode D2. Compared to the cascode switch 200a of FIG. 8A, except that the cascode switch 200a" of FIG. 8C further includes the second diode D2, its configuration and role are identical. The anode of the second diode D2 is connected to the source terminal S. The cathode of the second diode D2 is connected to the drain terminal D. The configuration and role of the second diode D2 shown in FIGS. 8C to 18C are the same as described with reference to FIG. 1C. Accordingly, detailed description for this will be omitted.

Figure 9A:
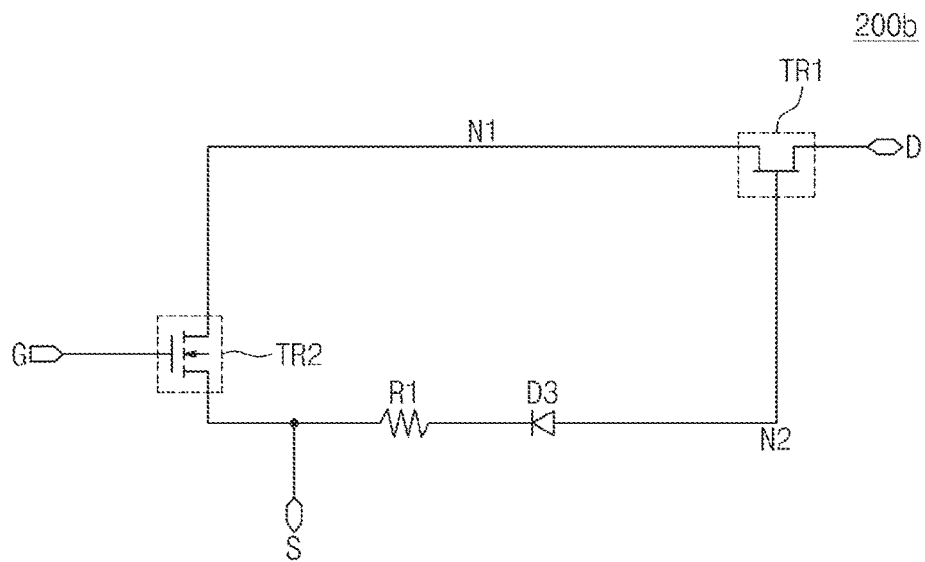

Referring to FIG. 9A, a cascode switch 200b may include first and second transistors TR1 and TR2, a resistor R1, and a third diode D3. The basic configuration is identical to that of the cascode switch 200 of FIG. 3A. However, compared to FIG. 3A, the cascode switch 200b does not include the second and third protectors 120 and 130. Additionally, the cascode switch 200b includes the resistor R1 and the third diode D3 connected in series as an embodiment of the first protector 110. The resistor R1 is connected between a source terminal S and the cathode of the third diode D3. The cathode of the third diode D3 is connected to one end of the resistor R1. The anode of the third diode D3 is connected to the second node N2. The resistor R1 and the third diode D3 prevent the destruction of the first transistor TR1 due to surge voltage.

Figure 9B:
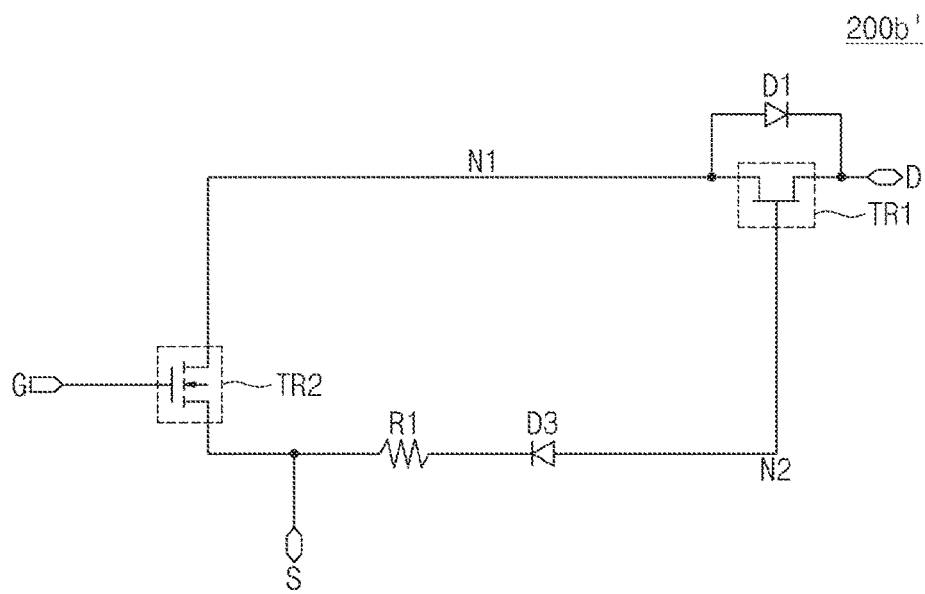

Referring to FIG. 9B, the cascode switch 200b' may include first and second transistors TR1 and TR2, a resistor R1, and first and third diodes D1 and D3. Compared to the cascode switch 200b of FIG. 9A, except that the cascode switch 200b' of FIG. 9B further includes the first diode D1, its configuration and role are identical.

Figure 9C:
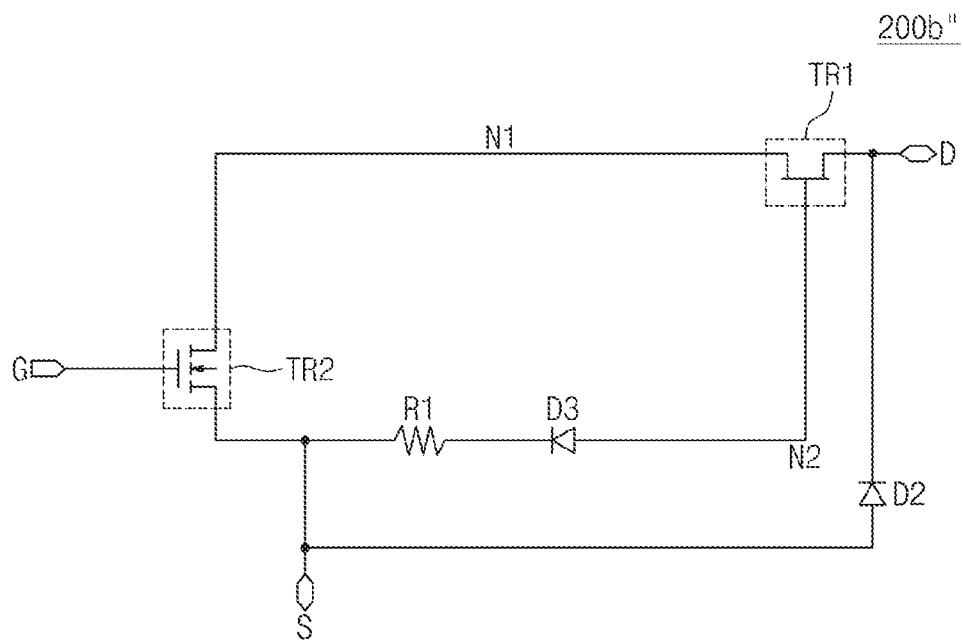

Referring to FIG. 9C, the cascode switch 200b" may include first and second transistors TR1 and TR2, a resistor R1, and second and third diodes D2 and D3. Compared to the cascode switch 200b of FIG. 9A, except that the cascode switch 200b" of FIG. 9C further includes the second diode D2, its configuration and role are identical.

Figure 10A:
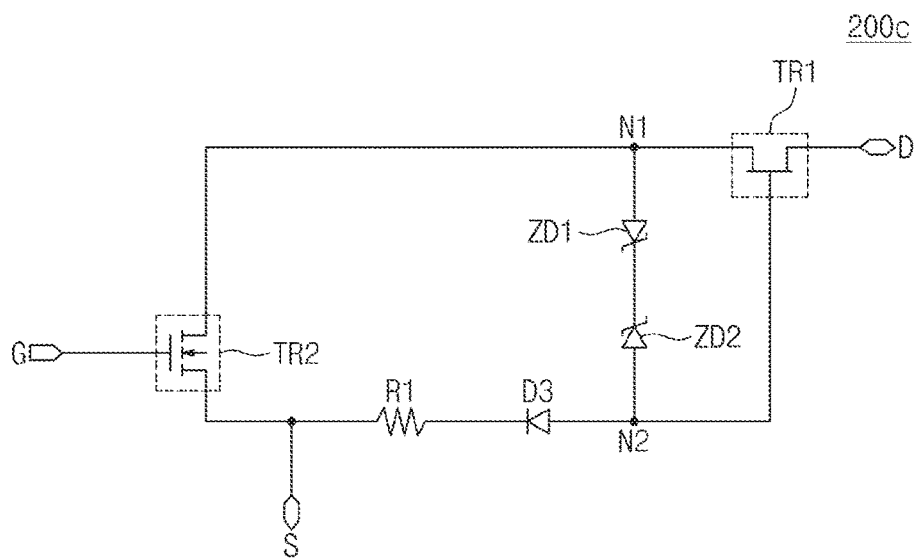

Referring to FIG. 10A, the cascode switch 200b may include first and second transistors TR1 and TR2, a resistor R1, a third diode D3, and two zener diodes ZD1 and ZD2 connected in series in a reverse direction. The basic configuration is identical to that of the cascode switch 200 of FIG. 3A. However, compared to FIG. 3A, the cascode switch 200c does not include the third protectors 130. The cascode switch 200c includes the resistor R1 and the third diode D3 connected in series as an embodiment of the first protector 110. Additionally, the cascode switch 200c includes two zener diodes ZD1 and ZD2 connected in series in a reverse direction as an embodiment of the second protector 120. The zener diodes ZD1 and ZD2 are connected between a first node N1 and a second N2. The resistor R1, the third diode D3, and the zener diodes ZD1 and ZD2 prevent the destruction of the first transistor TR1 due to surge voltage.

Figure 10B:
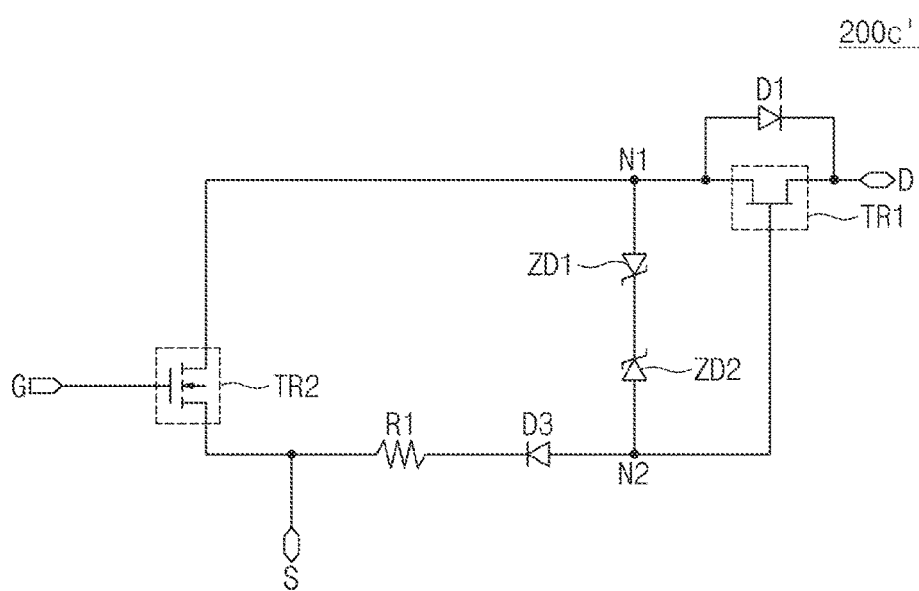

Referring to FIG. 10B, the cascode switch 200c' may include first and second transistors TR1 and TR2, a resistor R1, first and third diodes D1 and D3, and two zener diodes ZD1 and ZD2 connected in series in a reverse direction. Compared to the cascode switch 200c of FIG. 10A, except that the cascode switch 200c' of FIG. 10B further includes the first diode D1, its configuration and role are identical.

Figure 10C:
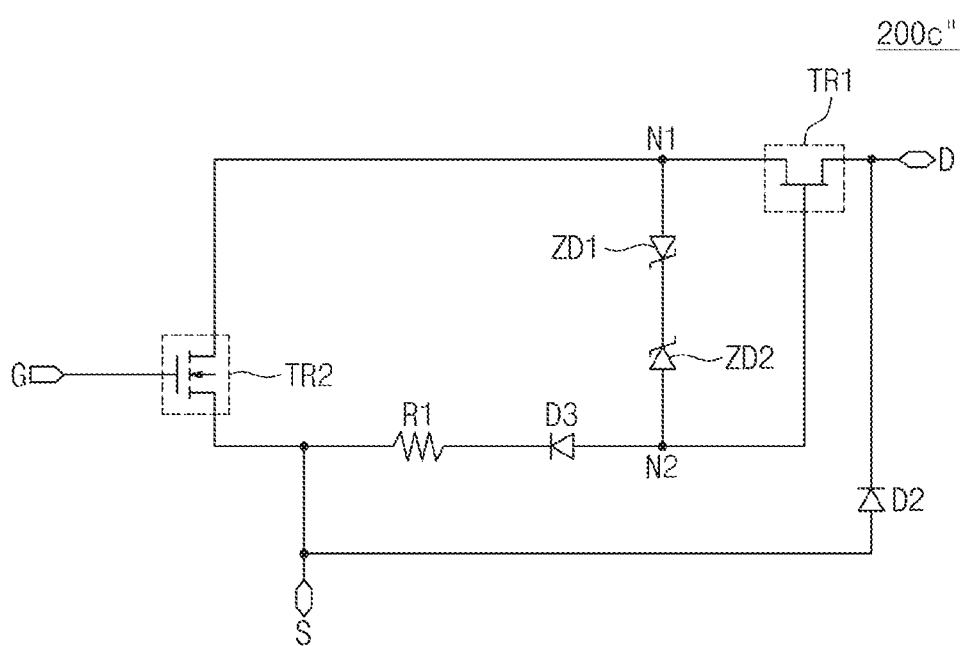

Referring to FIG. 10C, the cascode switch 200c" may include first and second transistors TR1 and TR2, a resistor R1, second and third diodes D2 and D3, and two zener diodes ZD1 and ZD2 connected in series in a reverse direction. Compared to the cascode switch 200c of FIG. 10A, except that the cascode switch 200c" of FIG. 10C further includes the second diode D2, its configuration and role are identical.

Figure 11A:
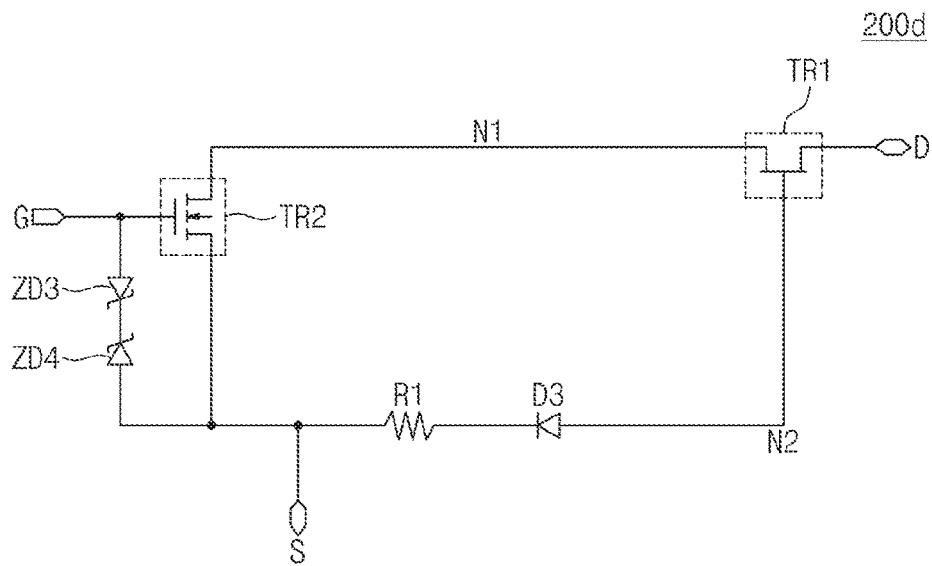

Referring to FIG. 11A, the cascode switch 200d may include first and second transistors TR1 and TR2, a resistor R1, a third diode D3, and two zener diodes ZD3 and ZD4 connected in series in a reverse direction. The basic configuration is identical to that of the cascode switch 200 of FIG. 3A. However, compared to FIG. 3A, the cascode switch 200d does not include the second protectors 120. The cascode switch 200d includes the resistor R1 and the third diode D3 connected in series as an embodiment of the first protector 110. Additionally, the cascode switch 200d includes two zener diodes ZD3 and ZD4 connected in series in a reverse direction as an embodiment of the third protector 130. The zener diodes ZD3 and ZD4 are connected between the gate terminal G and the source terminal S. The zener diodes ZD3 and ZD4 prevent the destruction of the second transistor TR2 due to surge voltage. The resistor R1 and the third diode D3 connected in series prevent the destruction of the first transistor TR1 due to surge voltage.

Figure 11B:
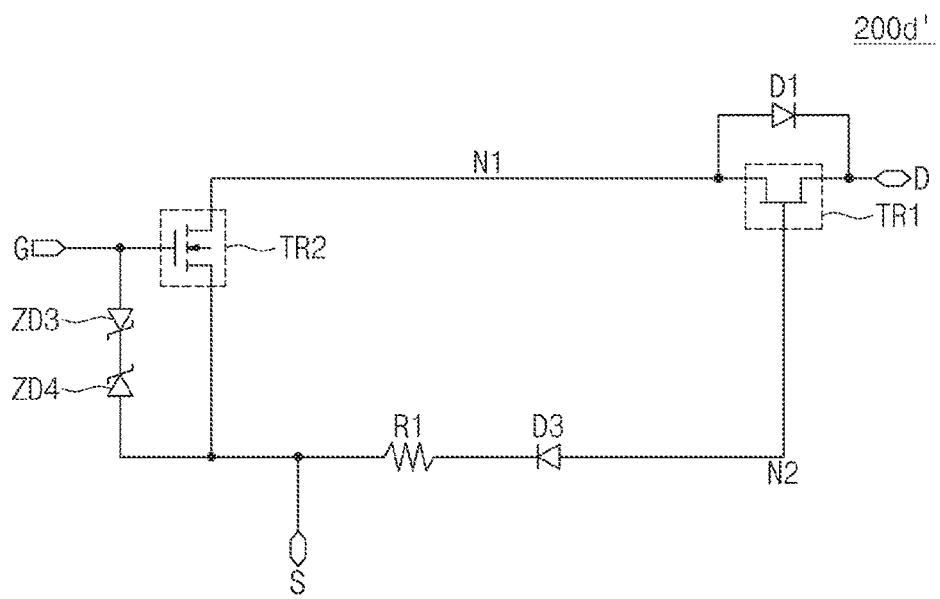

Referring to FIG. 11B, the cascode switch 200d' may include first and second transistors TR1 and TR2, a resistor R1, first and third diodes D1 and D3, and two zener diodes ZD3 and ZD4 connected in series in a reverse direction. Compared to the cascode switch 200d of FIG. 11A, except that the cascode switch 200d' of FIG. 11B further includes the first diode D1, its configuration and role are identical.

Figure 11C:
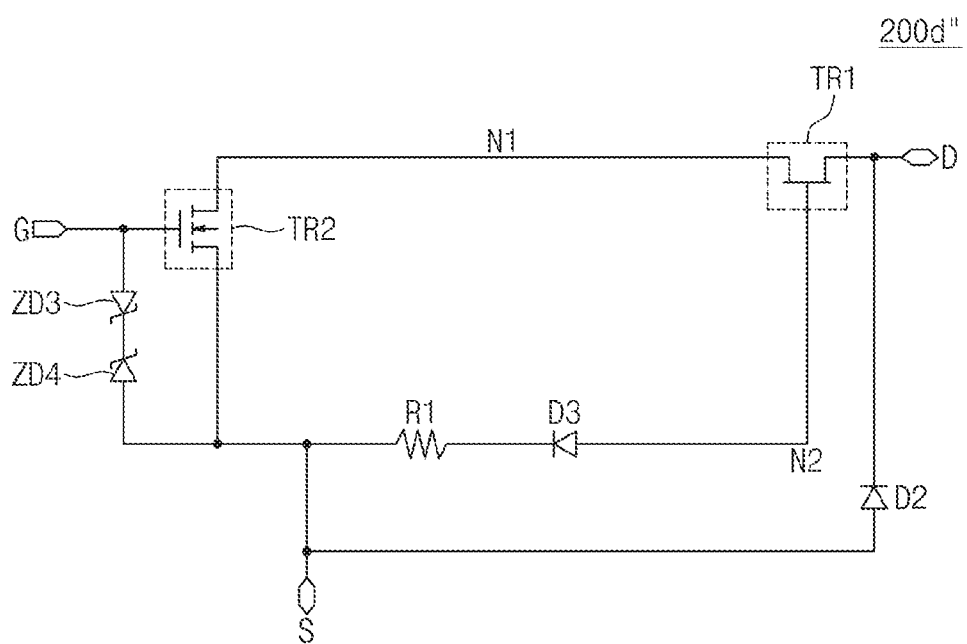

Referring to FIG. 11C, the cascode switch 200d" may include first and second transistors TR1 and TR2, a resistor R1, second and third diodes D2 and D3, and two zener diodes ZD3 and ZD4 connected in series in a reverse direction. Compared to the cascode switch 200d of FIG. 11A, except that the cascode switch 200d" of FIG. 11C further includes the second diode D2, its configuration and role are identical.

Figure 12A:
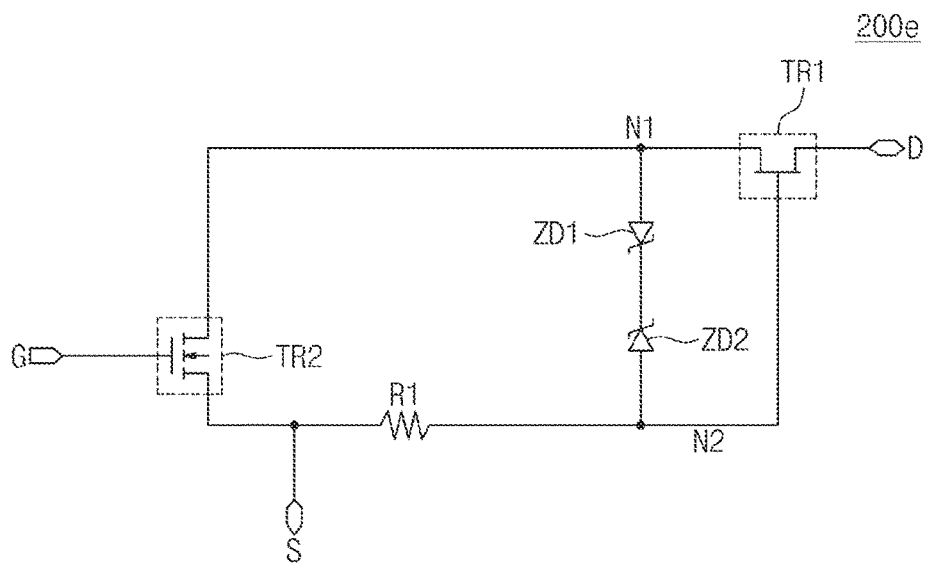

Referring to FIG. 12A, the cascode switch 200e may include first and second transistors TR1 and TR2, a resistor R1, and two zener diodes ZD1 and ZD2 connected in series in a reverse direction. The basic configuration is identical to that of the cascode switch 200 of FIG. 3A. However, compared to FIG. 3A, the cascode switch 200e does not include the third protectors 130. The cascode switch 200e includes the resistor R1 as an embodiment of the first protector 110. Additionally, the cascode switch 200e includes two zener diodes ZD1 and ZD2 connected in series in a reverse direction as an embodiment of the second protector 120. The resistor R1 and the zener diodes ZD1 and ZD2 prevent the destruction of the first transistor TR1 due to surge voltage.

Figure 12B:
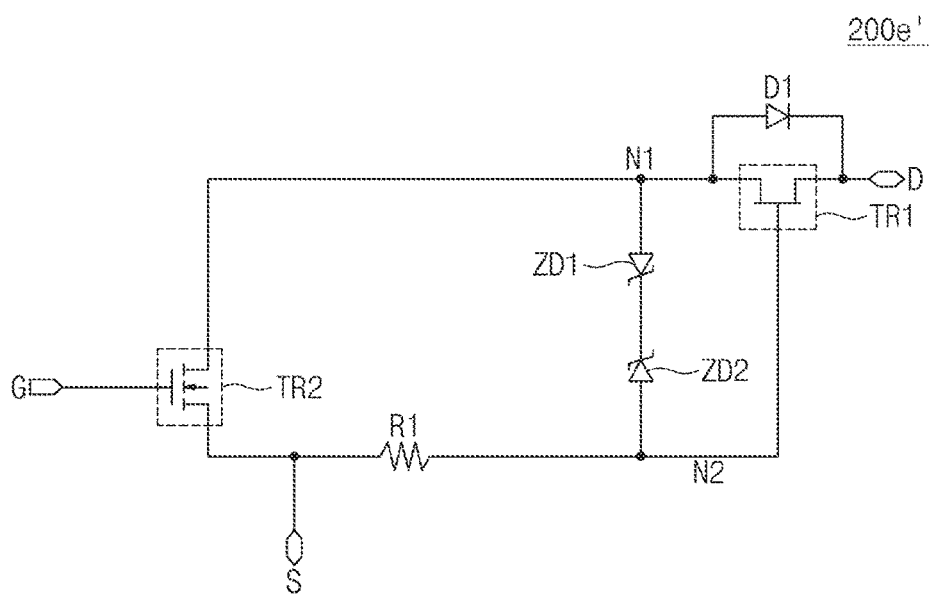

Referring to FIG. 12B, the cascode switch 200e' may include first and second transistors TR1 and TR2, a resistor R1, a first diode D1, and two zener diodes ZD1 and ZD2 connected in series in a reverse direction. Compared to the cascode switch 200e of FIG. 12A, except that the cascode switch 200e' of FIG. 12B further includes the first diode D1, its configuration and role are identical.

Figure 12C:
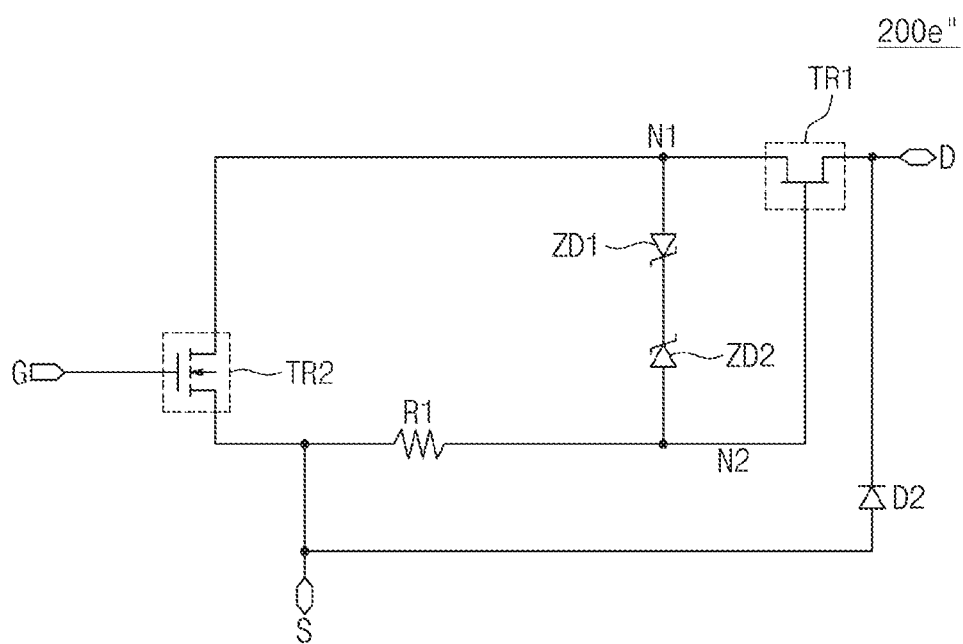

Referring to FIG. 12C, the cascode switch 200e" may include first and second transistors TR1 and TR2, a resistor R1, a second diode D2, and two zener diodes ZD1 and ZD2 connected in series in a reverse direction. Compared to the cascode switch 200e of FIG. 12A, except that the cascode switch 200e" of FIG. 12C further includes the second diode D2, its configuration and role are identical.

Figure 13A:
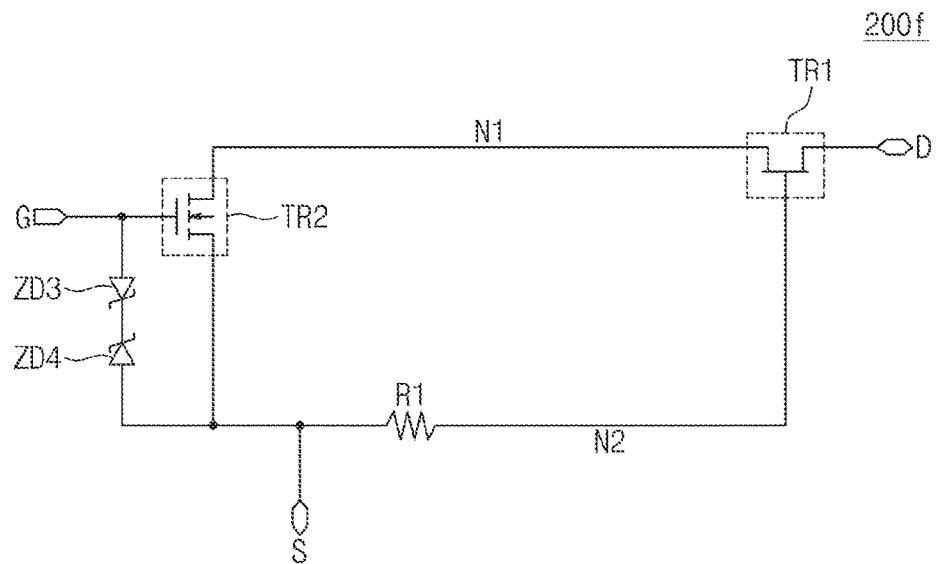

Referring to FIG. 13A, the cascode switch 200f may include first and second transistors TR1 and TR2, a resistor R1, and two zener diodes ZD3 and ZD4 connected in series in a reverse direction. The basic configuration is identical to that of the cascode switch 200 of FIG. 3A. However, compared to FIG. 3A, the cascode switch 200f does not include the second protectors 120. The cascode switch 200f includes the resistor R1 as an embodiment of the first protector 110. Additionally, the cascode switch 200f includes two zener diodes ZD3 and ZD4 connected in series in a reverse direction as an embodiment of the third protector 130. The resistor R1 prevents the destruction of the first transistor TR1 due to surge voltage. The zener diodes ZD3 and ZD4 prevent the destruction of the second transistor TR2 due to surge voltage.

Figure 13B:
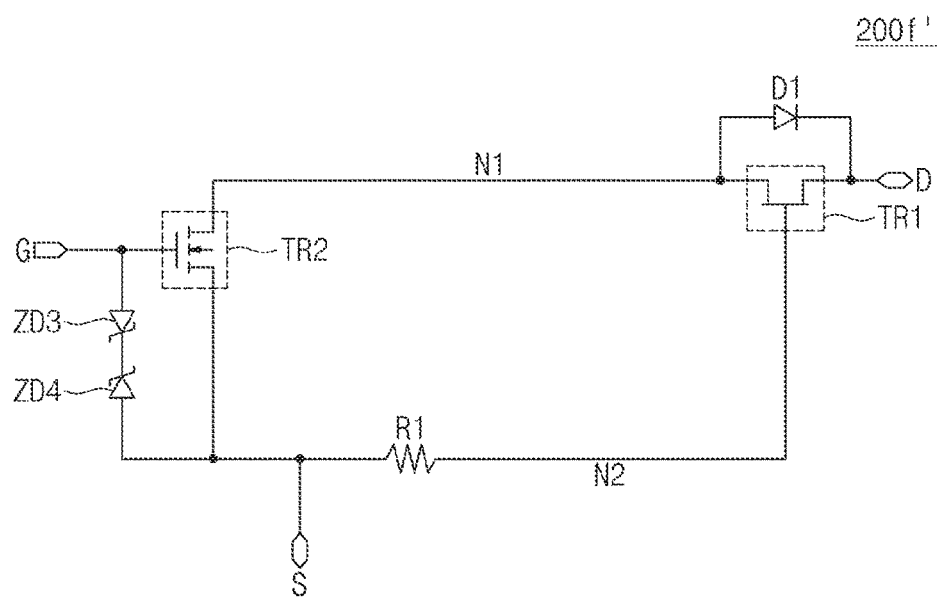

Referring to FIG. 13B, the cascode switch 200f' may include first and second transistors TR1 and TR2, a resistor R1, a first diode D1, and two zener diodes ZD3 and ZD4 connected in series in a reverse direction. Compared to the cascode switch 200f of FIG. 13A, except that the cascode switch 200f' of FIG. 13B further includes the first diode D1, its configuration and role are identical.

Figure 13C:
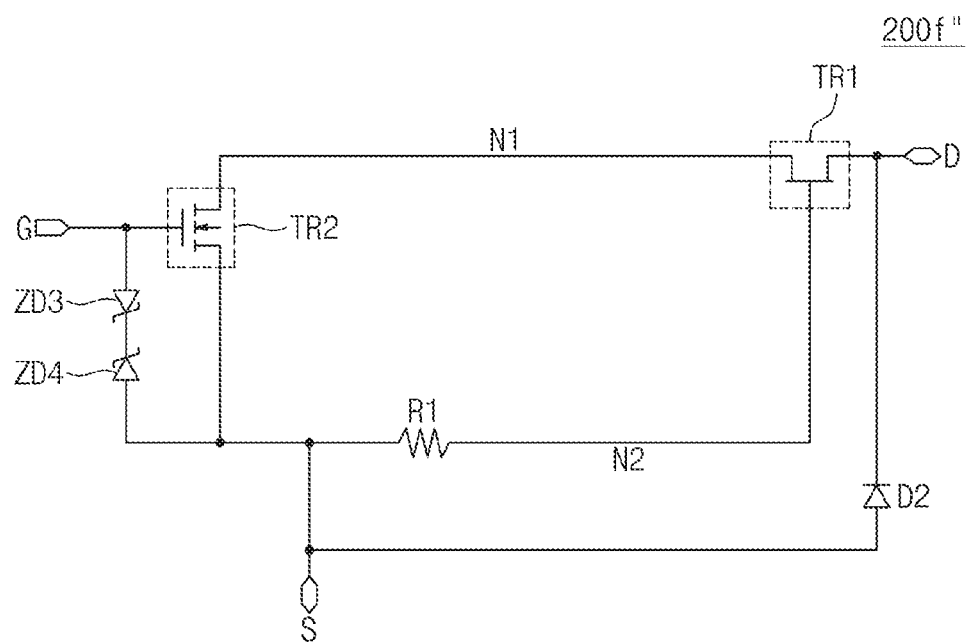

Referring to FIG. 13C, the cascode switch 200f" may include first and second transistors TR1 and TR2, a resistor R1, a second diode D2, and two zener diodes ZD3 and ZD4 connected in series in a reverse direction. Compared to the cascode switch 200f of FIG. 13A, except that the cascode switch 200f" of FIG. 13C further includes the second diode D2, its configuration and role are identical.

Figure 14A:
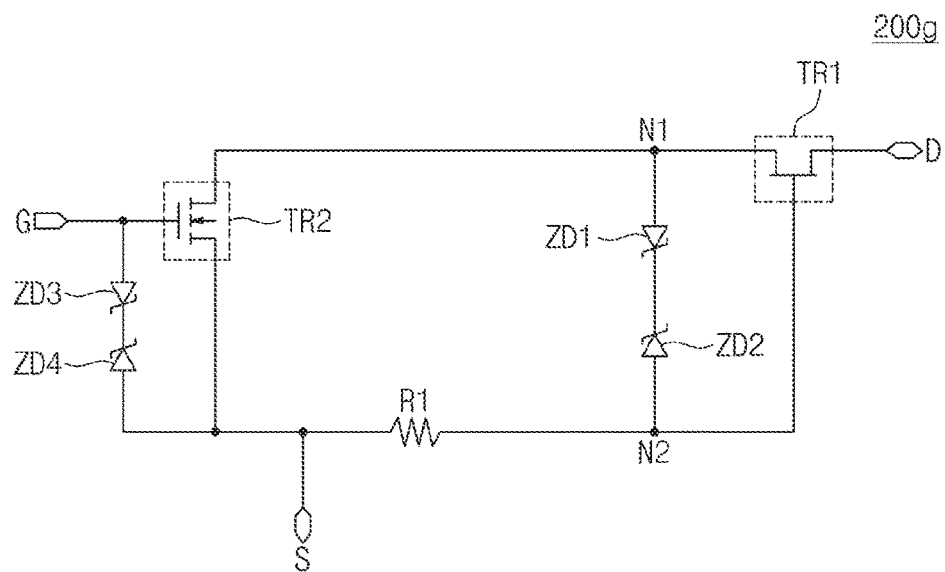

Referring to FIG. 14A, the cascode switch 200g may include first and second transistors TR1 and TR2, a resistor R1, and four zener diodes ZD1, ZD2, ZD3, and ZD4 connected in series in a reverse direction. The basic configuration is identical to that of the cascode switch 200 of FIG. 3A. The cascode switch 200g includes the resistor R1 as an embodiment of the first protector 110. Then, the cascode switch 200g includes two zener diodes ZD1 and ZD2 connected in series in a reverse direction as an embodiment of the second protector 120. Additionally, the cascode switch 200g includes two zener diodes ZD3 and ZD4 connected in series in a reverse direction as an embodiment of the third protector 130. The resistor R1 and the zener diodes ZD1 and ZD2 connected between the first node N1 and the second node N2 prevent the destruction of the first transistor TR1 due to surge voltage. The zener diodes ZD3 and ZD4 connected between the gate terminal G and the source terminal S prevent the destruction of the second transistor TR2 due to surge voltage.

Figure 14B:
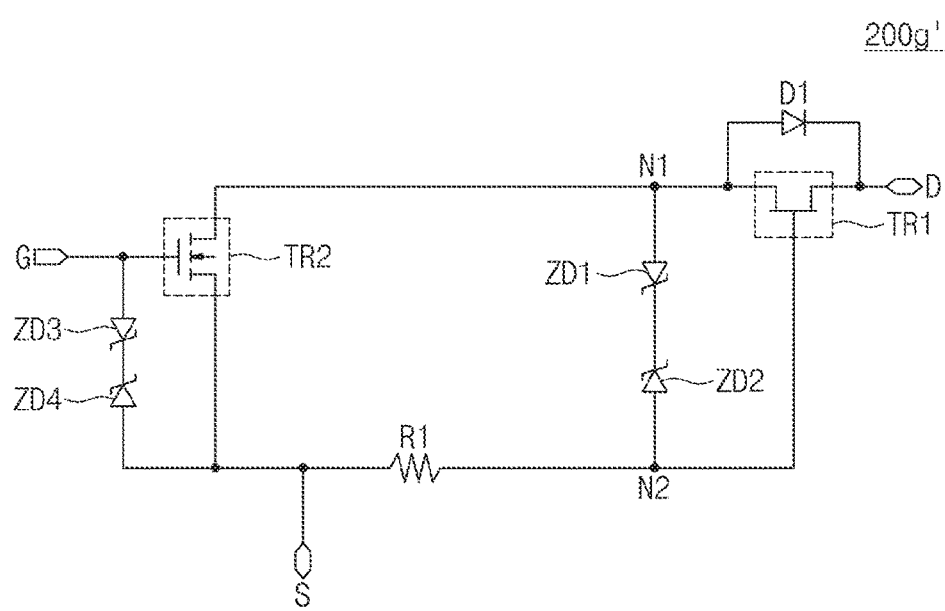

Referring to FIG. 14B, the cascode switch 200g' may include first and second transistors TR1 and TR2, a resistor R1, a first diode D1, and four zener diodes ZD1, ZD2, ZD3, and ZD4 connected in series in a reverse direction. Compared to the cascode switch 200g of FIG. 14A, except that the cascode switch 200g' of FIG. 14B further includes the first diode D1, its configuration and role are identical.

Figure 14C:
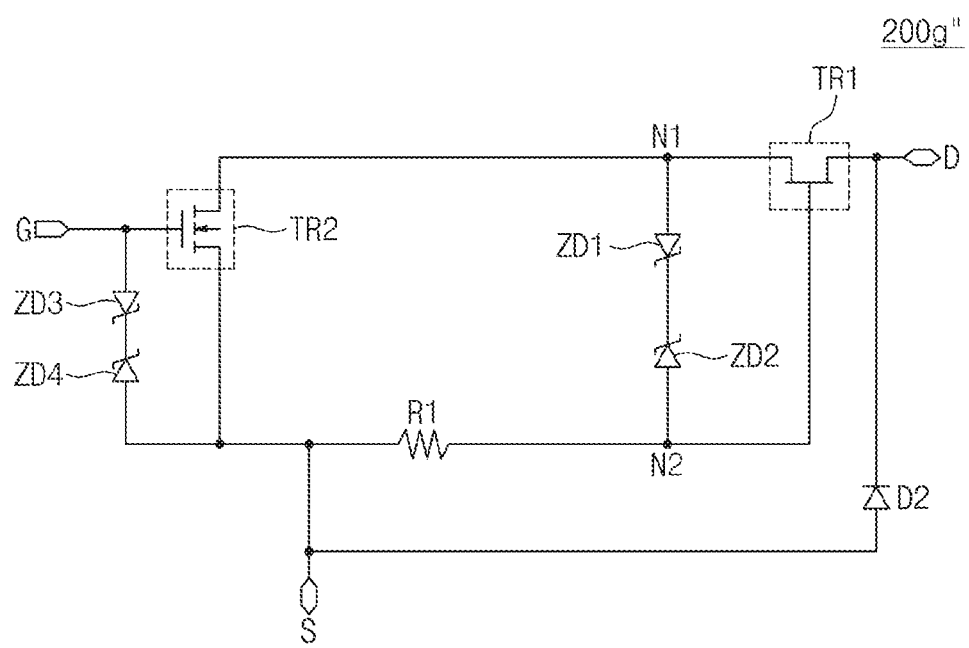

Referring to FIG. 14C, the cascode switch 200g' may include first and second transistors TR1 and TR2, a resistor R1, a second diode D2, and four zener diodes ZD1, ZD2, ZD3, and ZD4 connected in series in a reverse direction. Compared to the cascode switch 200g of FIG. 14A, except that the cascode switch 200g" of FIG. 14C further includes the second diode D2, its configuration and role are identical.

Figure 15A:
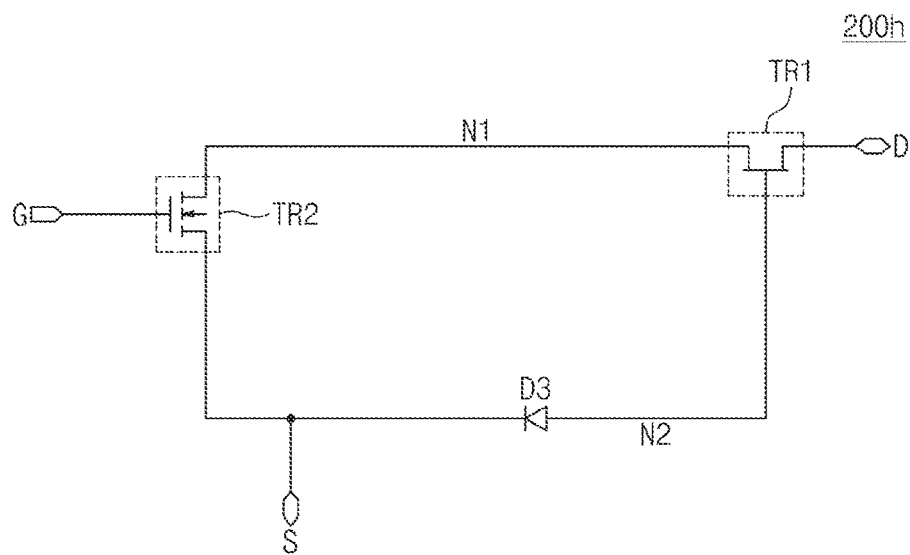

Referring to FIG. 15A, the cascode switch 200h may include first and second transistors TR1 and TR2, and a third diode D3. The basic configuration is identical to that of the cascode switch 200 of FIG. 3A. However, compared to FIG. 3A, the cascode switch 200h does not include the second and third protectors 120 and 130. Additionally, the cascode switch 200h includes the third diode D3 as an embodiment of the first protector 110. The third diode D3 prevents the destruction of the first transistor TR1 due to surge voltage.

Figure 15B:
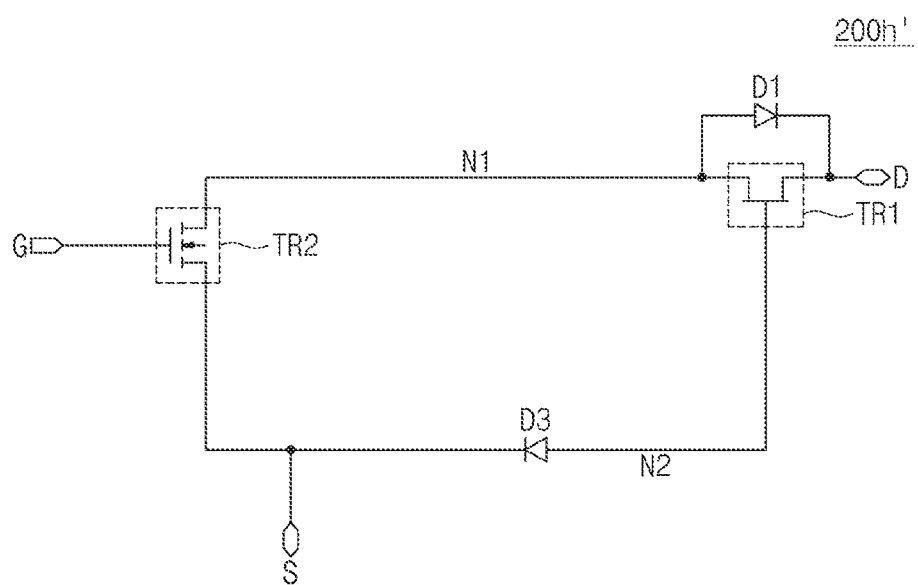

Referring to FIG. 15B, the cascode switch 200h' may include first and second transistors TR1 and TR2, and first and third diodes D1 and D3. Compared to the cascode switch 200h of FIG. 15A, except that the cascode switch 200h' of FIG. 15B further includes the first diode D1, its configuration and role are identical.

Figure 15C:
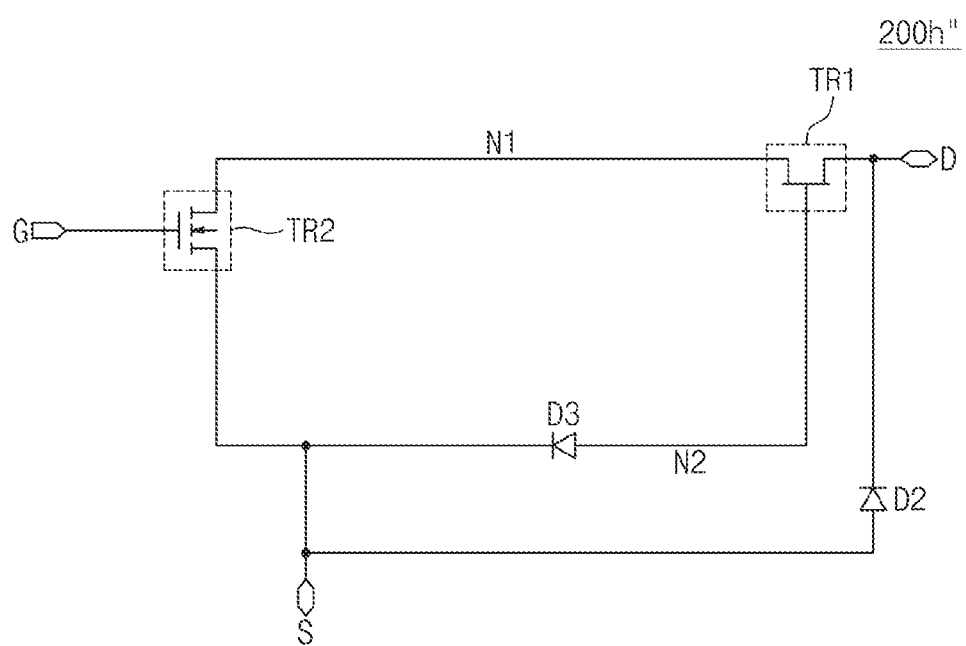

Referring to FIG. 15C, the cascode switch 200h" may include first and second transistors TR1 and TR2, and second and third diodes D2 and D3. Compared to the cascode switch 200h of FIG. 15A, except that the cascode switch 200h" of FIG. 15C further includes the second diode D2, its configuration and role are identical.

Figure 16A:
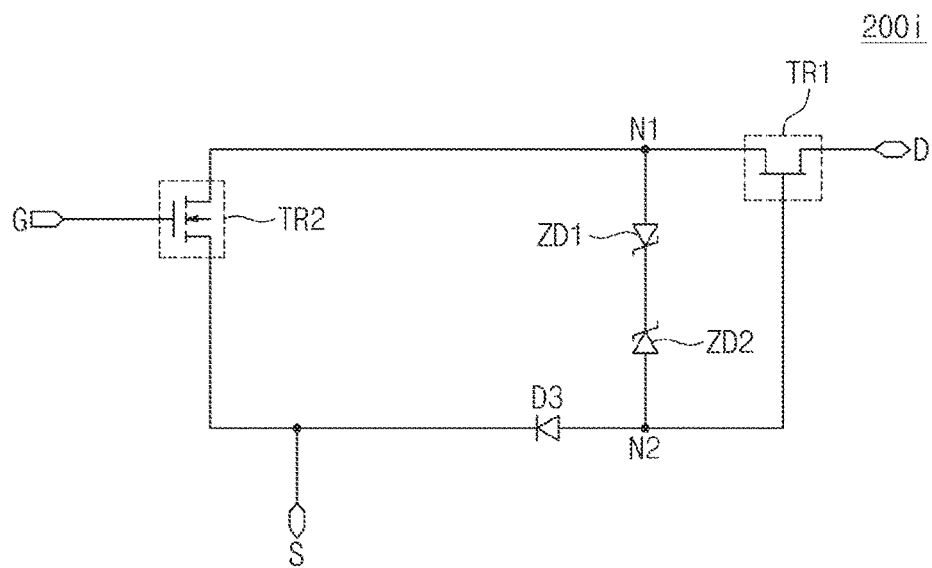

Referring to FIG. 16A, the cascode switch 200i may include first and second transistors TR1 and TR2, a third diode D3, and two zener diodes ZD1 and ZD2 connected in series in a reverse direction. The basic configuration is identical to that of the cascode switch 200 of FIG. 3A. However, compared to FIG. 3A, the cascode switch 200i does not include the third protectors 130. The cascode switch 200i includes the third diode D3 as an embodiment of the first protector 110. Additionally, the cascode switch 200i includes two zener diodes ZD1 and ZD2 connected in series in a reverse direction as an embodiment of the second protector 120. The third diode D3 and the zener diodes ZD1 and ZD2 prevent the destruction of the first transistor TR1 due to surge voltage.

Figure 16B:
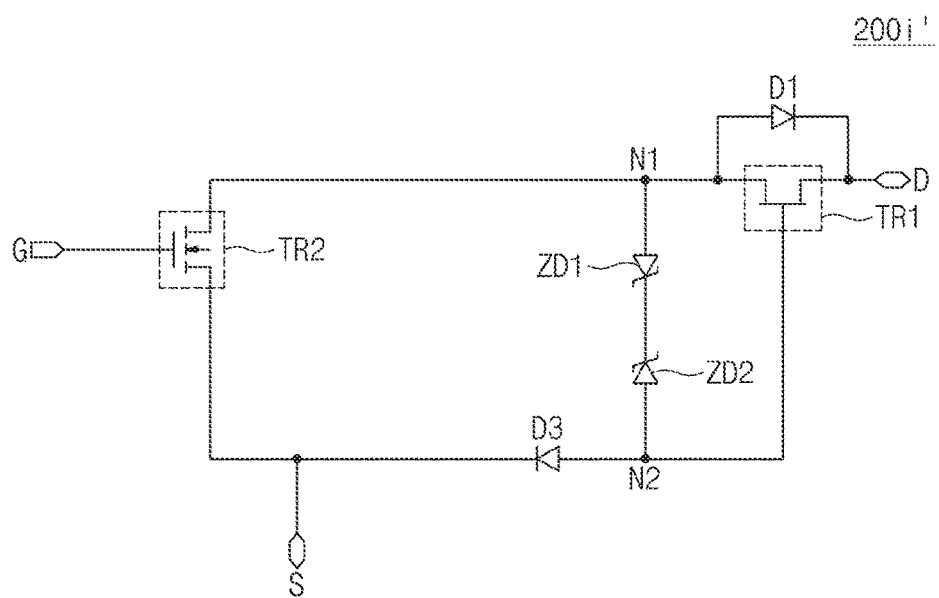

Referring to FIG. 16B, the cascode switch 200i' may include first and second transistors TR1 and TR2, first and third diodes D1 and D3, and two zener diodes ZD1 and ZD2 connected in series in a reverse direction. Compared to the cascode switch 200i of FIG. 16A, except that the cascode switch 200i' of FIG. 16B further includes the first diode D1, its configuration and role are identical.

Figure 16C:
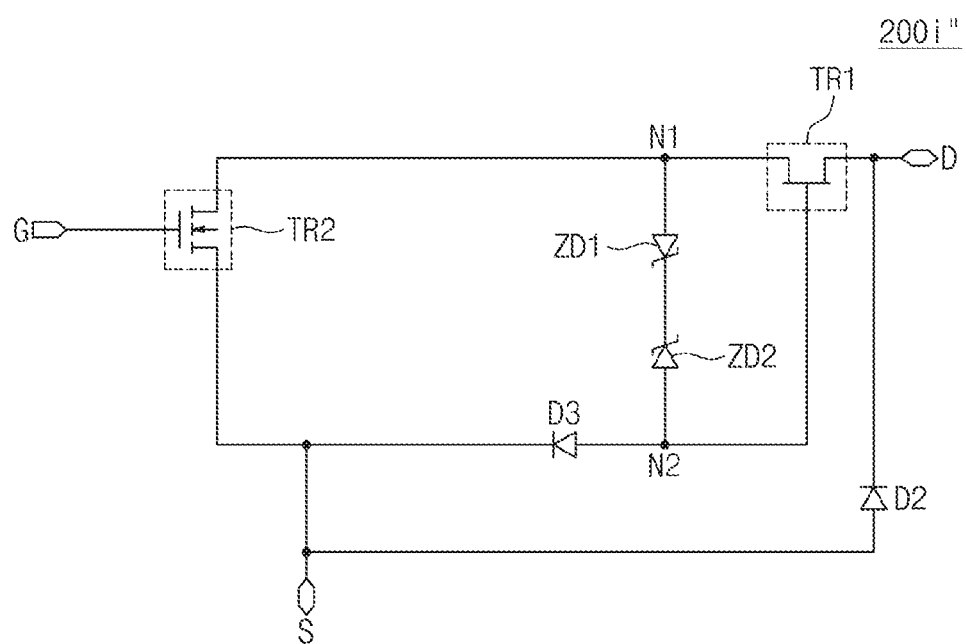

Referring to FIG. 16C, the cascode switch 200i'' may include first and second transistors TR1 and TR2, second and third diodes D2 and D3, and two zener diodes ZD1 and ZD2 connected in series in a reverse direction. Compared to the cascode switch 200i of FIG. 16A, except that the cascode switch 200i'' of FIG. 16C further includes the second diode D2, its configuration and role are identical.

Figure 17A:
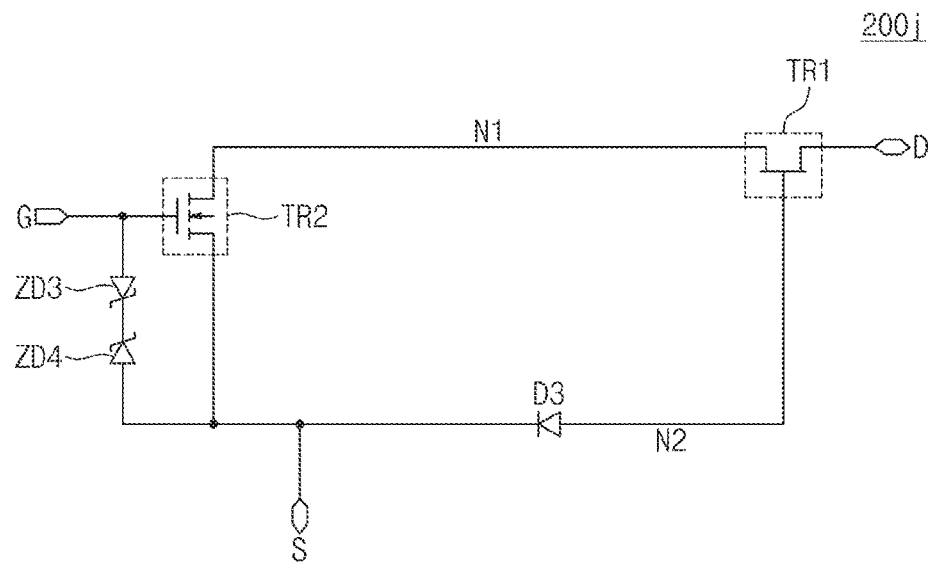

Referring to FIG. 17A, the cascode switch 200j may include first and second transistors TR1 and TR2, a third diode D3, and two zener diodes ZD3 and ZD4 connected in series in a reverse direction. The basic configuration is identical to that of the cascode switch 200 of FIG. 3A. However, compared to FIG. 3A, the cascode switch 200j does not include the second protectors 120. The cascode switch 200j includes the third diode D3 as an embodiment of the first protector 110. Additionally, the cascode switch 200j includes two zener diodes ZD3 and ZD4 connected in series in a reverse direction as an embodiment of the third protector 130. The third diode D3 prevents the destruction of the first transistor TR1 due to surge voltage. The zener diodes ZD3 and ZD4 prevent the destruction of the second transistor TR2 due to surge voltage.

Figure 17B:
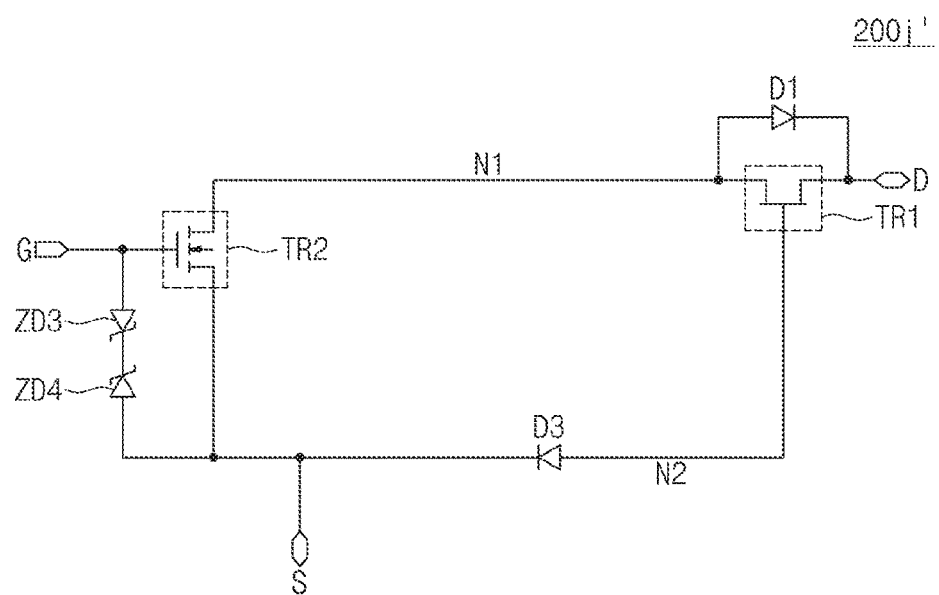

Referring to FIG. 17B, the cascode switch 200j' may include first and second transistors TR1 and TR2, first and third diodes D1 and D3, and two zener diodes ZD3 and ZD4 connected in series in a reverse direction. Compared to the cascode switch 200j of FIG. 17A, except that the cascode switch 200j' of FIG. 17B further includes the first diode D1, its configuration and role are identical.

Figure 17C:
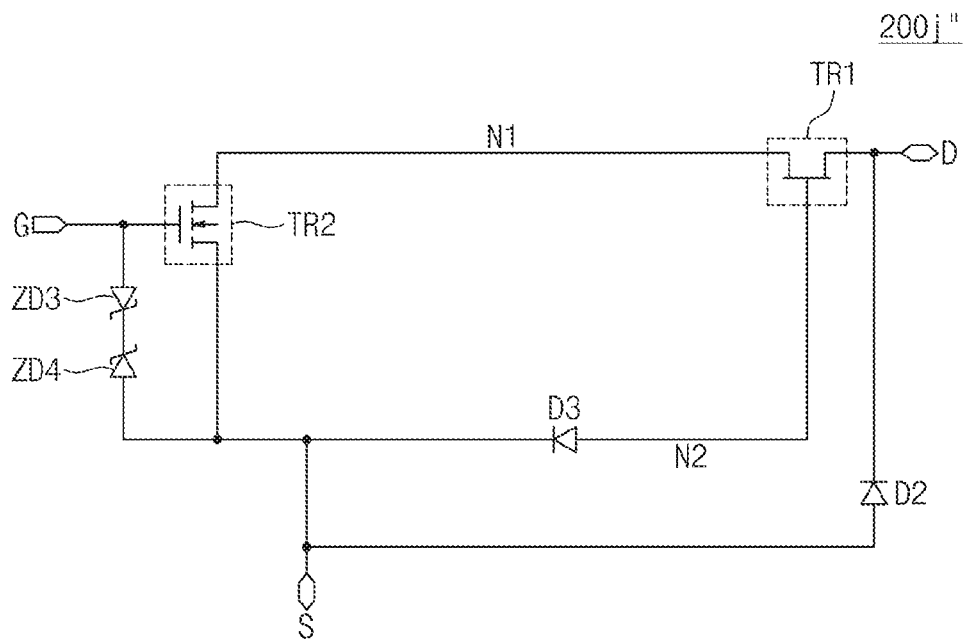

Referring to FIG. 17C, the cascode switch 200j'' may include first and second transistors TR1 and TR2, second and third diodes D2 and D3, and two zener diodes ZD3 and ZD4 connected in series in a reverse direction. Compared to the cascode switch 200j of FIG. 17A, except that the cascode switch 200j'' of FIG. 17C further includes the second diode D2, its configuration and role are identical.

Figure 18A:
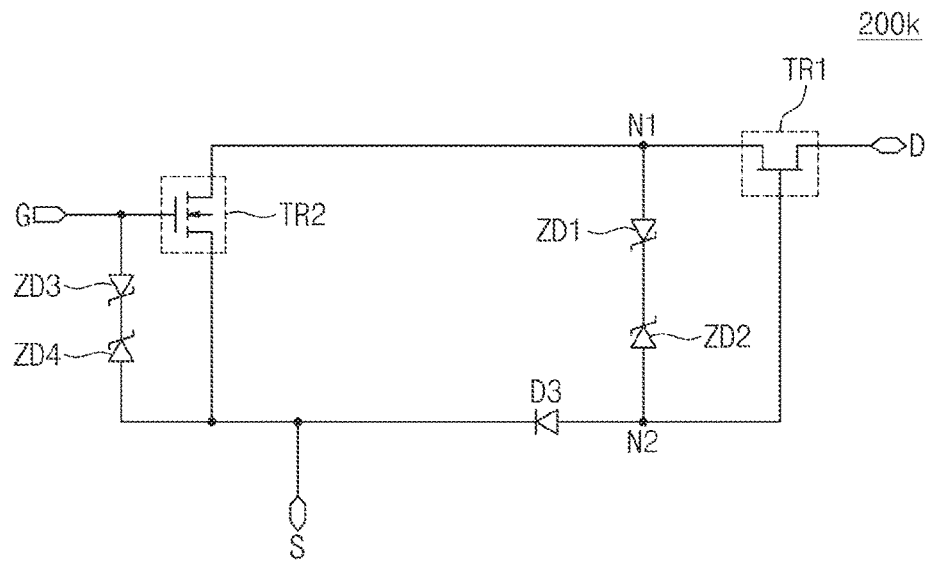

Referring to FIG. 18A, the cascode switch 200k may include first and second transistors TR1 and TR2, a third diode D3, and four zener diodes ZD1, ZD2, ZD3, and ZD4 connected in series in a reverse direction. The basic configuration is identical to that of the cascode switch 200 of FIG. 3A. The cascode switch 200k includes the third diode D3 as an embodiment of the first protector 110. Then, the cascode switch 200k includes two zener diodes ZD1 and ZD2 connected in series in a reverse direction as an embodiment of the second protector 120. Additionally, the cascode switch 200k includes two zener diodes ZD3 and ZD4 connected in series in a reverse direction as an embodiment of the third protector 130. The third diode D3 and the zener diodes ZD1 and ZD2 connected between the first node N1 and the second node N2 prevent the destruction of the first transistor TR1 due to surge voltage. The zener diodes ZD3 and ZD4 connected between the gate terminal G and the source terminal S prevent the destruction of the second transistor TR2 due to surge voltage.

Figure 18B:
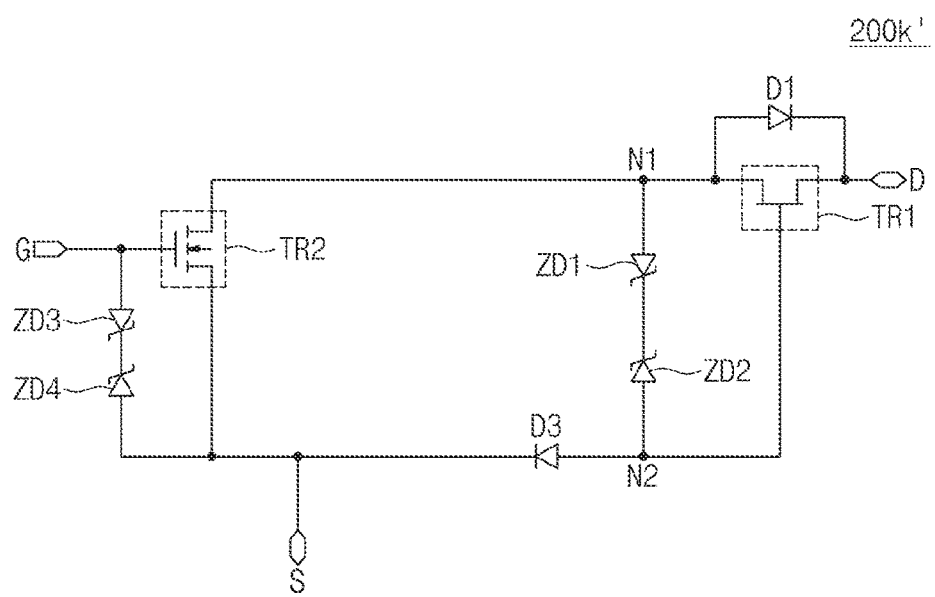

Referring to FIG. 18B, the cascode switch 200k' may include first and second transistors TR1 and TR2, first and third diodes D1 and D3, and four zener diodes ZD1, ZD2, ZD3, and ZD4 connected in series in a reverse direction. Compared to the cascode switch 200k of FIG. 18A, except that the cascode switch 200k' of FIG. 18B further includes the first diode D1, its configuration and role are identical.

Figure 18C:
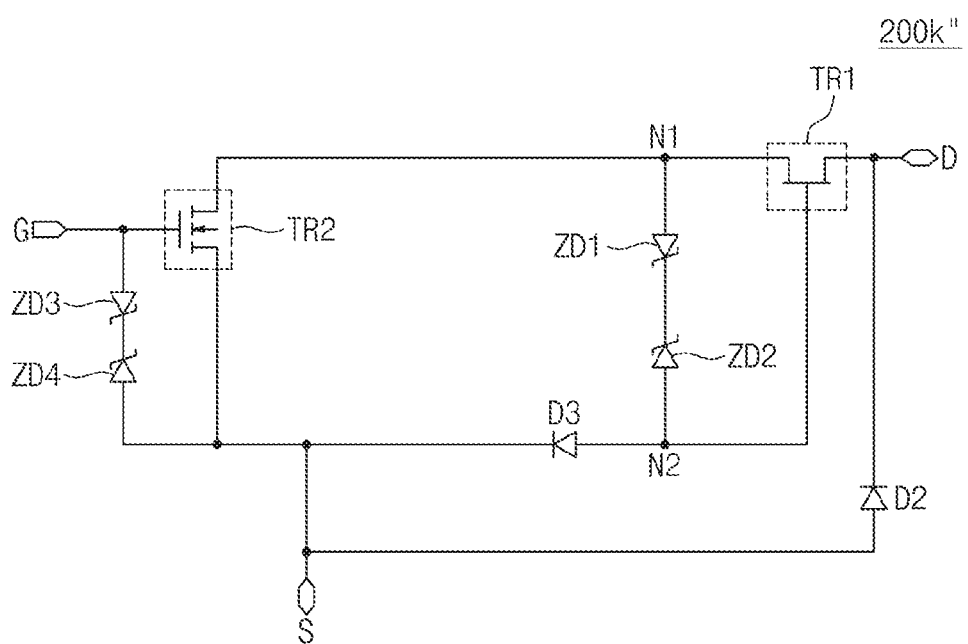

Referring to FIG. 18C, the cascode switch 200k'' may include first and second transistors TR1 and TR2, second and third diodes D2 and D3, and four zener diodes ZD1, ZD2, ZD3, and ZD4 connected in series in a reverse direction. Compared to the cascode switch 200k of FIG. 18A, except that the cascode switch 200k'' of FIG. 18C further includes the second diode D2, its configuration and role are identical.

According to an embodiment of the inventive concept, the destruction or deterioration of a cascode switch circuit due to unexpectedly occurring surge voltage or current, may be prevented.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A cascode switch circuit comprising:
a first transistor configured to receive a signal from a first terminal through a first end of the first transistor and deliver the signal to a second end of the first transistor in response to a first control signal;
a second transistor configured to receive at a first end of the second transistor only the signal from the first terminal and to transfer the signal to a second terminal through a second end of the second transistor in response to a second control signal; and
a protector connected between a gate of the first transistor and the second terminal, the protector comprising a first diode and resistor,
wherein the first control signal is provided to allow the first transistor to operate in a normally-on state, and the second control signal is provided to allow the second transistor to operate in a normally-off state, and
wherein the first transistor, second transistor, and protector are configured such that current is permitted to flow freely between the gate of the first transistor and the second terminal in a first current flow direction, and the current is prevented, based on a breakdown voltage of the first diode, from flowing between the gate of the first transistor and the second terminal in a second current flow direction.

2. The cascode switch circuit of claim 1, further comprising a second diode connected in parallel to the first transistor and having a cathode connected to the first end of the first transistor and an anode connected to the second end of the first transistor.

3. The cascode switch circuit of claim 2, wherein the first transistor and the second diode are implemented on one chip, and the first end of the first transistor is connected to the cathode of the second diode through a first metallic line and the second end of the first transistor is connected to the anode of the second diode through a second metallic line.

4. The cascode switch circuit of claim 1, further comprising a second diode having a cathode connected to the first terminal and an anode connected to the second terminal.

5. The cascode switch circuit of claim 4, wherein the first transistor and the second diode are implemented on one chip, and the first end of the first transistor is connected to the cathode of the third diode through a metallic line.

6. The cascode switch circuit of claim 1, wherein the first diode has a cathode connected to the second terminal and an anode connected to the gate of the first transistor.

7. The cascode switch circuit of claim 6, further comprising a second diode connected in parallel to the first transistor and having a cathode connected to the first end of the first transistor and an anode connected to the second end of the first transistor.

8. The cascode switch circuit of claim 6, further comprising a second diode having a cathode connected to the first terminal and an anode connected to the second terminal.

9. The cascode switch circuit of claim 1, wherein
the resistor has a first end connected to the second terminal; and
the first diode has a cathode connected to a second end of the resistor and an anode connected to the gate of the first transistor.

10. The cascode switch circuit of claim 9, further comprising a second diode connected in parallel to the first transistor and having a cathode connected to the first end of the first transistor and an anode connected to the second end of the first transistor.

11. The cascode switch circuit of claim 9, further comprising a second diode having a cathode connected to the first terminal and an anode connected to the second terminal.

12. The cascode switch circuit of claim 1, wherein the first transistor comprises a GaN transistor.

13. The cascode switch circuit of claim 1, wherein the second transistor comprises a metal-oxide-semiconductor field-effect transistor (MOSFET).

14. The cascode switch circuit of claim 1, further comprising a third transistor connected in parallel to the first transistor and controlled commonly with the first transistor.

15. The cascode switch circuit of claim 1, further comprising a third transistor connected in parallel to the second transistor and controlled commonly with the second transistor.

16. The cascode switch circuit of claim 1, further comprising a second protector connected between the gate of the first transistor and the second end of the first transistor, the second protector comprising a pair of zener diodes connected in series.

17. The cascode switch circuit of claim 1, wherein only the second end of the second transistor and one end of the protector are connected to the second terminal.

* * * * *